(12) United States Patent
Mallik et al.

(10) Patent No.: US 12,476,174 B2
(45) Date of Patent: *Nov. 18, 2025

(54) ULTRA-THIN, HYPER-DENSITY SEMICONDUCTOR PACKAGES

(71) Applicant: Intel Corporation, Santa Clara, CA (US)

(72) Inventors: Debendra Mallik, Chandler, AZ (US); Robert L Sankman, Phoenix, AZ (US); Robert Nickerson, Chandler, AZ (US); Mitul Modi, Phoenix, AZ (US); Sanka Ganesan, Chandler, AZ (US); Rajasekaran Swaminathan, Chandler, AZ (US); Omkar Karhade, Chandler, AZ (US); Shawna M. Liff, Scottsdale, AZ (US); Amruthavalli Alur, Tempe, AZ (US); Sri Chaitra J. Chavali, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/375,133

(22) Filed: Sep. 29, 2023

(65) Prior Publication Data
US 2024/0030116 A1 Jan. 25, 2024

Related U.S. Application Data

(63) Continuation of application No. 18/091,982, filed on Dec. 30, 2022, which is a continuation of application
(Continued)

(51) Int. Cl.
*H01L 23/498* (2006.01)
*H01L 23/00* (2006.01)
(Continued)

(52) U.S. Cl.
CPC .... *H01L 23/49811* (2013.01); *H01L 23/3128* (2013.01); *H01L 23/5389* (2013.01); *H01L 24/29* (2013.01)

(58) Field of Classification Search
CPC .......... H01L 23/49811; H01L 23/3128; H01L 23/5389; H01L 24/29
See application file for complete search history.

(56) References Cited

U.S. PATENT DOCUMENTS

| 7,777,351 B1 | 8/2010 | Berry |
| 8,975,726 B2 | 3/2015 | Chen |

(Continued)

FOREIGN PATENT DOCUMENTS

KR 10-1788412 11/2017

OTHER PUBLICATIONS

Office Action for U.S. Appl. No. 17/862,300 mailed Nov. 21, 2024, 16 pgs.
(Continued)

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

Ultra-thin, hyper-density semiconductor packages and techniques of forming such packages are described. An exemplary semiconductor package is formed with one or more of: (i) metal pillars having an ultra-fine pitch (e.g., a pitch that is greater than or equal to 150 μm, etc.); (ii) a large die-to-package ratio (e.g., a ratio that is equal to or greater than 0.85, etc.); and (iii) a thin pitch translation interposer. Another exemplary semiconductor package is formed using coreless substrate technology, die back metallization, and low temperature solder technology for ball grid array (BGA) metallurgy. Other embodiments are described.

20 Claims, 15 Drawing Sheets

Related U.S. Application Data

No. 17/862,300, filed on Jul. 11, 2022, which is a continuation of application No. 16/646,529, filed as application No. PCT/US2017/069138 on Dec. 30, 2017, now Pat. No. 11,430,724.

(51) Int. Cl.
*H01L 23/31* (2006.01)
*H01L 23/538* (2006.01)

(56) References Cited

U.S. PATENT DOCUMENTS

| | | |
|---|---|---|
| 9,385,009 B2 | 7/2016 | Lin |
| 9,397,050 B2 | 7/2016 | Shin |
| 9,412,689 B2 | 8/2016 | Lin |
| 9,461,018 B1 | 10/2016 | Tsai |
| 9,583,430 B2 | 2/2017 | Park |
| 9,607,967 B1 | 3/2017 | Shih |
| 9,633,974 B2 | 4/2017 | Zhai |
| 9,824,990 B2 | 11/2017 | Chen |
| 9,881,908 B2 | 1/2018 | Lin |
| 9,991,190 B2 | 6/2018 | Huang |
| 10,079,192 B2 | 9/2018 | Hsiao |
| 10,083,913 B2 | 9/2018 | Tsai |
| 10,229,859 B2 | 3/2019 | Wang |
| 10,319,607 B2 | 6/2019 | Wu |
| 10,483,211 B2 | 11/2019 | Lin |
| 11,101,214 B2 | 8/2021 | Tsai |
| 11,430,724 B2 * | 8/2022 | Mallik .................. H01L 25/0655 |
| 2008/0017968 A1 | 1/2008 | Choi |
| 2008/0308950 A1 | 12/2008 | Yoo |
| 2012/0211885 A1 | 8/2012 | Choi |
| 2014/0103488 A1 * | 4/2014 | Chen .................. H01L 24/19 |
| | | 257/532 |
| 2015/0235934 A1 | 8/2015 | Wu |
| 2015/0270192 A1 | 9/2015 | Bar |
| 2016/0057863 A1 | 2/2016 | Kyozuka |
| 2016/0099231 A1 | 4/2016 | Yang |
| 2016/0225692 A1 | 8/2016 | Kim |
| 2016/0260684 A1 * | 9/2016 | Zhai .................... H01L 25/0652 |
| 2016/0329262 A1 * | 11/2016 | Hsiao ................ H01L 23/49894 |
| 2016/0372338 A1 | 12/2016 | Liang |
| 2017/0040308 A1 | 2/2017 | Ko |
| 2017/0084555 A1 | 3/2017 | Yu |
| 2017/0133310 A1 | 5/2017 | Kelly |
| 2017/0141058 A1 * | 5/2017 | Lee ....................... H01L 23/481 |
| 2017/0207173 A1 | 7/2017 | Hsu |
| 2017/0345788 A1 | 11/2017 | Pan |
| 2018/0012880 A1 * | 1/2018 | Yang ...................... H01L 25/50 |
| 2018/0082933 A1 * | 3/2018 | Ko ......................... H01L 21/568 |
| 2018/0096968 A1 * | 4/2018 | Lee ..................... H01L 25/0652 |
| 2018/0096976 A1 * | 4/2018 | Lin ......................... H01L 24/19 |

OTHER PUBLICATIONS

Office Action for U.S. Appl. No. 18/091,982 mailed Nov. 21, 2024, 16 pgs.
Office Action for German Patent Application No. 112017008404.0 mailed Nov. 20, 2024, 11 pgs.
Office Action for U.S. Appl. No. 17/862,300 mailed Mar. 31, 2025, 14 pgs.
Notice of Allowance for U.S. Appl. No. 18/091,982 mailed May 19, 2025, 7 pgs.
Office Action for U.S. Appl. No. 18/091,982 mailed Mar. 13, 2025, 13 pgs.
International Search Report and Written Opinion for International Patent Application No. PCT/US2017/069138 mailed Sep. 28, 2018, 17 pgs.
International Preliminary Report on Patentability for International Patent Application No. PCT/US2017/069138 mailed Jul. 9, 2020, 12 pgs.
Office Action for German Patent Application No. 112017008340.0 mailed Sep. 29, 2025, 10 pgs.
Office Action for German Patent Application No. 112017008442.3 mailed Oct. 1, 2025, 7 pgs.

* cited by examiner

FIG. 2F(ii)

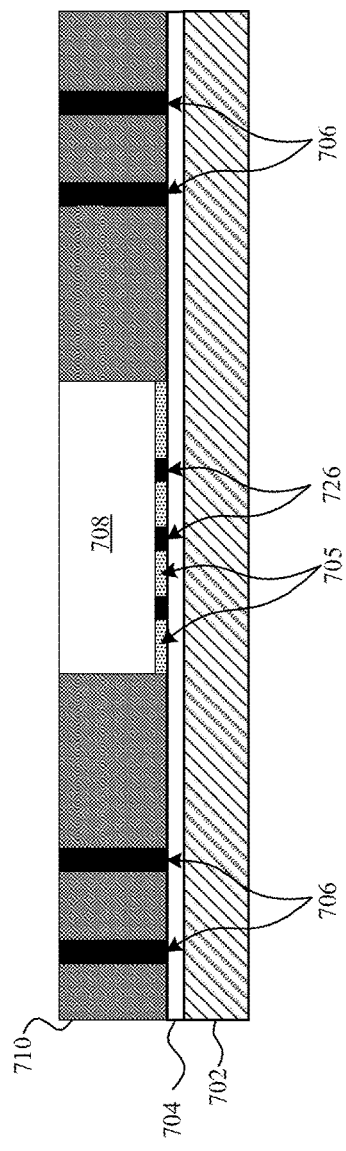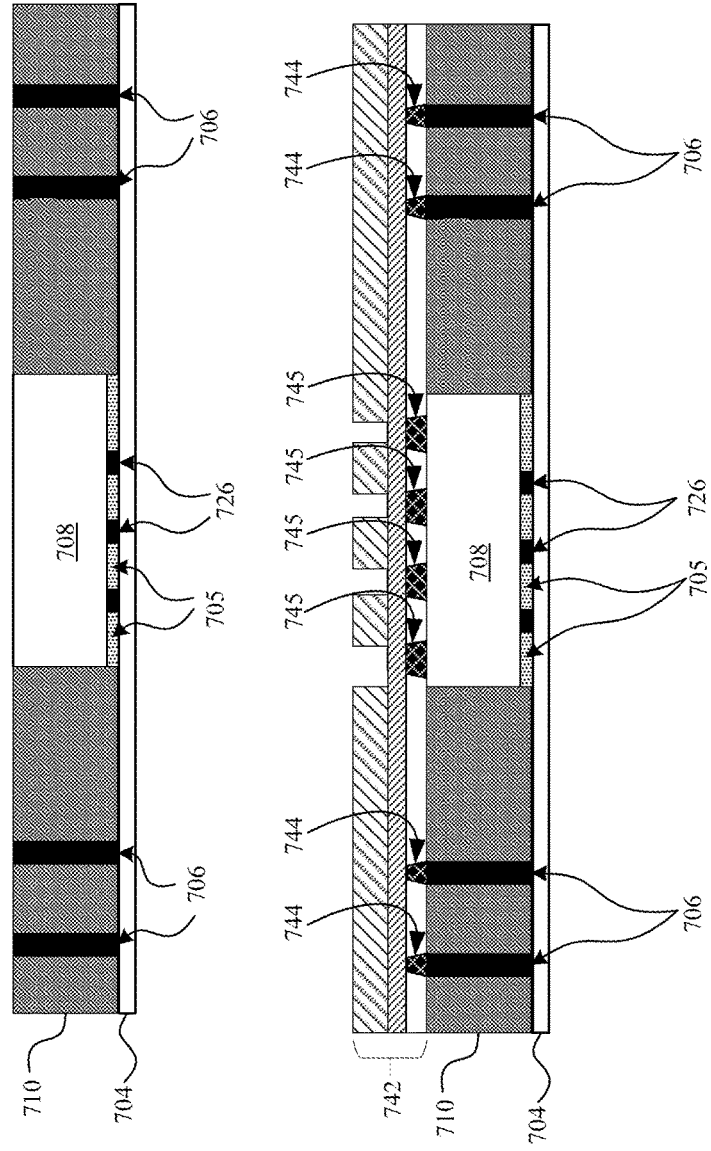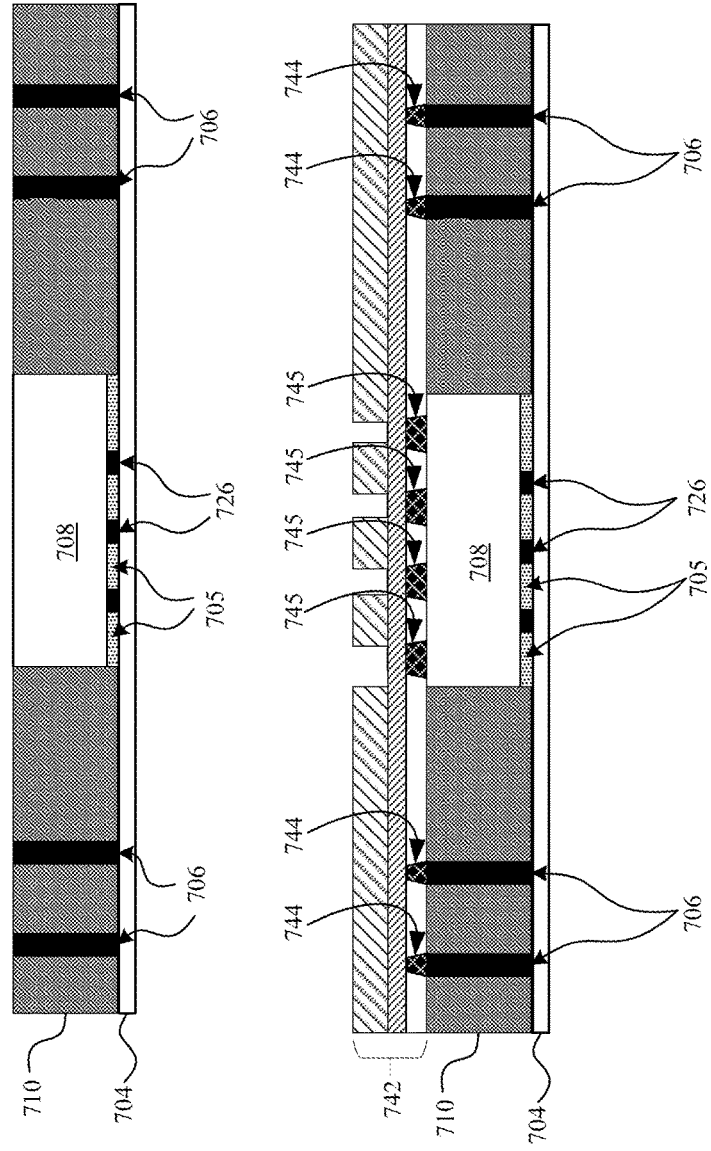
FIG. 7D
FIG. 7E
FIG. 7F

ULTRA-THIN, HYPER-DENSITY SEMICONDUCTOR PACKAGES

CROSS-REFERENCE TO RELATED APPLICATION

This patent application is a continuation of U.S. patent application Ser. No. 18/091,982, filed Dec. 30, 2022, which is a continuation of U.S. patent application Ser. No. 17/862,300, filed Jul. 11, 2022, which is a continuation of U.S. patent application Ser. No. 16/646,529, filed Mar. 11, 2020, now U.S. Pat. No. 11,430,724, issued Aug. 30, 2022, which is a U.S. National Phase Application under 35 U.S.C. § 371 of International Application No. PCT/US2017/069138, filed Dec. 30, 2017, entitled "ULTRA-THIN, HYPER-DENSITY SEMICONDUCTOR PACKAGES," which designates the United States of America, the entire disclosure of which are hereby incorporated by reference in their entirety and for all purposes.

FIELD

Embodiments generally relate to semiconductor packages. More specifically, embodiments relate to ultra-thin, hyper-density semiconductor packages and techniques of forming such packages.

BACKGROUND INFORMATION

Conventional semiconductor package substrates typically include at least one core layer impregnated in a dielectric material to provide mechanical rigidity to the substrate. Latest trends of electronic devices such as mobile phones, mobile internet devices (MIDs), multimedia devices and computer notebooks demand for slimmer and lighter designs. Coreless substrates are adopted for fabrication of components in such electronic devices to enable a thinner profile of the components. The thickness of coreless substrates can be, for example, as little as approximately 25% of the thickness of cored substrates.

Cored and coreless substrates may be susceptible to warpage problems during Surface Mount Technology (SMT) processes. Furthermore, coreless substrates, in some scenarios, may be more susceptible to warpage problems during SMT processes (when compared to conventional substrates with core layers). SMT processes typically involve subjecting package substrates to heating and cooling which in turn create expansion and contraction of the substrate. The difference in coefficient of thermal expansion (CTE) of the various materials forming the substrate results in different rates of expansion and contraction and hence stress in the substrate. The resulting stress warps the substrate and causes manufacturing problems during component package assembly as well as during performance of SMT processes. As demand for smaller, and higher performing devices continues to grow, packages will get thinner and pitch (e.g., spacing between package components, etc.) will get finer, which may increase the occurrence of warpage in cored or coreless packages. Increased warpage can undesirably result in failure or reduced performance of packages or increase problems related to the reliability of electronic devices having packages therein.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 7A-7G are cross-sectional side view illustrations of a method of forming an ultra-thin, hyper-density semiconductor package according one or more embodiments.

DETAILED DESCRIPTION

Embodiments described herein provide ultra-thin, hyper-density semiconductor packages and techniques of forming such packages. One advantage of the ultra-thin, hyper-density semiconductor packages fabricated in accord with the embodiments described herein is that such packages suffer from minimal or no warpage (when compared to cored and/or coreless packages fabricated using conventional techniques). In this way, packages fabricated in accord with the embodiments described herein can assist with avoiding warpage problems that occur during surface mount technology (SMT) processes. Furthermore, the embodiments described herein can assist with fabrication of packages having: (i) an ultra-thin z-height (e.g., a z-height that is less than or equal to 1 mm, etc.); and (ii) a die-to-package ratio (e.g., a ratio that is equal to or greater than 0.7, etc.). Such packages can be used in handheld and mobile-client products.

For one embodiment, a semiconductor package is formed with: (i) metal pillars having an ultra-fine pitch (e.g., a pitch that is greater than or equal to 150 μm, etc.); (ii) a large die-to-package ratio (e.g., a ratio that is equal to or greater than 0.85, etc.); and (iii) a thin pitch translation interposer. For one embodiment, a semiconductor package is formed using coreless substrate technology, die back metallization, and low temperature solder technology for ball grid array (BGA) metallurgy. Other embodiments are described below in connection with one or more of FIGS. 1A-8.

Figure 1A:
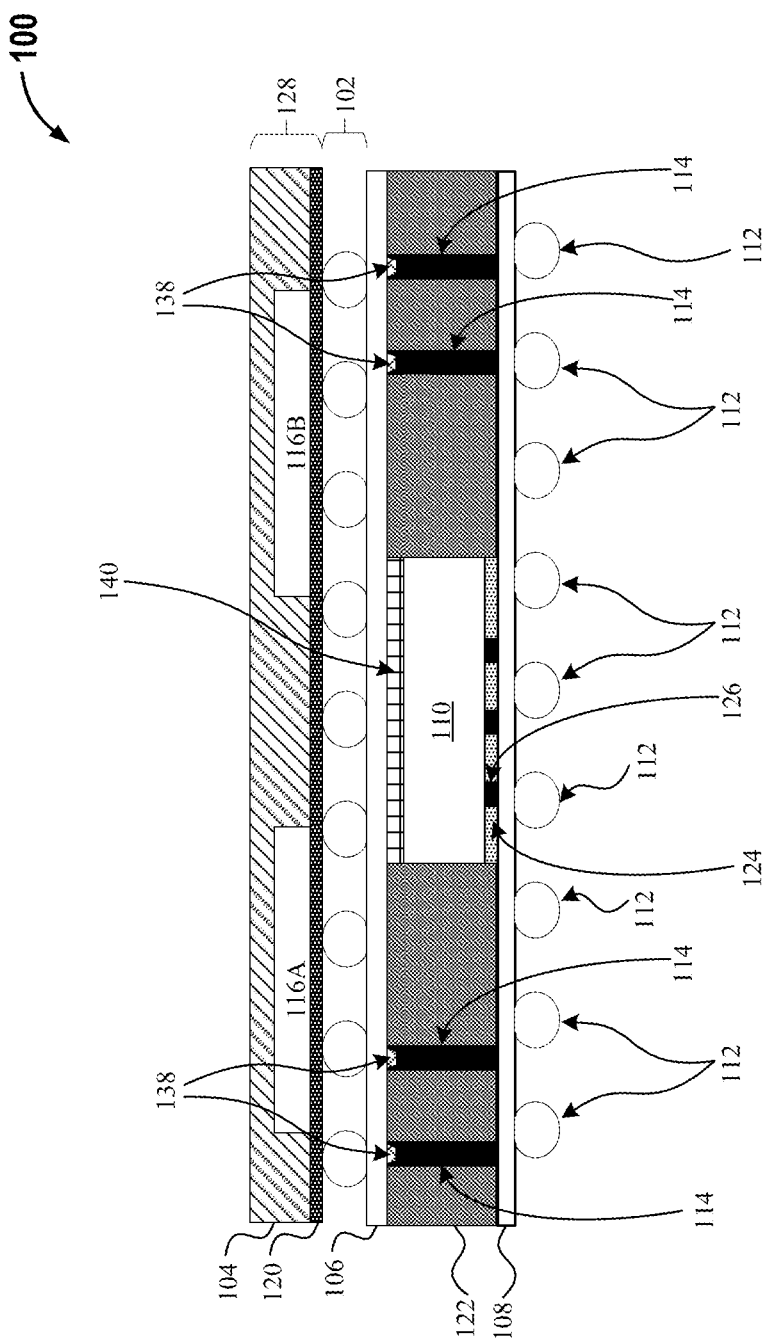
FIGS. 1A-1B are cross-sectional illustrations of ultra-thin, hyper-density semiconductor packages according one or more embodiments.

FIG. 1A is a cross-sectional illustration of an ultra-thin, hyper-density semiconductor package 100 that includes a package-on-package (PoP) architecture according one or more embodiments. The package 100 includes solder bumps 112, which may be low temperature solder bumps formed from tin (Sn) or tin alloys (e.g., Sn—Al alloys, Sn—In alloys, Sn—Bi alloys, etc.). For one embodiment, the solder bumps 112 are formed from an Sn-57 Bi-1 alloy.

The package 100 also includes a high density (HDP) ultra-thin substrate 108 onto which the solder bumps 112 are formed. The HDP substrate 108 may be formed from any suitable material (silicon, glass, metal, etc.). For one embodiment, the substrate 108 has a nominal thickness (i.e., z-height) of approximately 66 μm. For one embodiment, a top side of the substrate 108 has metal pillars 114 (e.g., copper pillars, etc.) formed thereon. For one embodiment, the metal pillars 114 have a maximum nominal thickness (i.e., z-height) that is approximately 150 μm. In a specific embodiment, a low temperature solder material (e.g., Sn57 Bi, SAC305, etc.) may be inserted into shallow holes formed in the top surfaces of the pillars 114 and reflowed to form solder caps 138. For one embodiment, the caps 138 are above the mold compound 122 by a predetermined z-height (e.g., approximately 10 μm, etc.). For one embodiment, low temperature solder may be inserted or applied to the shallow holes via a paste print solder process that involves using a stencil or via an injection molded solder (IMS) process. The solder caps 138 may be planarized and cleaned to achieve a desired z-height.

The package 100 also includes a component 110. For one embodiment, the component 110 can include one or more of a system-on-chip (SoC), a central processing unit (CPU) component, a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof. The component 110 may include one or more semiconductor dies mounted on the HDP substrate 108. The dies of the component 110 can be attached to the HDP substrate 108 according to a variety of suitable configurations including, a flip-chip configuration or other configurations such as wire bonding and the like. In the flip-chip configuration, an active side of the dies 102 is attached to a surface of the substrate 108 using interconnect structures such as bumps or pillars. Examples of such interconnect structures include, but are not limited to, Cu bumps, any type of low-lead or lead-free solder bumps, tin-copper bumps, Cu pillars, combinations thereof, or the like. The active side of the dies in the component 110 may have one or more transistor devices formed thereon. Each of the dies in the component 110 may represent a discrete chip. The dies in the component 110 may, include, or be a part of a processor, memory, or application specific integrated circuit (ASIC).

As shown in FIG. 1A, the component 110 may be coupled to the substrate 108 via the first level interconnects (FLIs) 126 and an epoxy layer 124. The FLIs 126 can have a nominal thickness (i.e., a z-height, etc.) of approximately 35 μm. The epoxy layer 124 can have a nominal thickness (i.e., a z-height, etc.) of approximately 25 μm. For some embodiments, a substrate pad may have nominal thickness (i.e., a z-height, etc.) of 40 μm. For some embodiments, a pad-trace component may have nominal thickness (i.e., a z-height, etc.) of 10 μm.

The component 110 and the pillars 114 may be encapsulated in a first mold compound 122. The component 110 may be a monolithic package (e.g., a monolithic SoC, etc.). Furthermore, the component 110 may be designed to have a nominal thickness (i.e., z-height) of approximately 125 μm.

The package 100 also includes an epoxy material 140 with a predetermined thickness (e.g., approximately 25 μm, etc.) and a predetermined thermal conductivity (e.g., approximately 3-5 W/mK, etc.) applied on the exposed top surface of the component 110. The epoxy material 140 can be a paste or a film. When the epoxy material 140 is a paste, it is printed onto the component 110. When the epoxy material 140 is a film, it is laminated onto the component 110.

For one embodiment, the pillars 114 (e.g., the solder caps 138, etc.) couple the substrate 108 to a pitch translation interposer 106. This coupling may be performed by reflow of the solder caps 138. Furthermore, the component 110 may be attached to the pitch translation interposer 106 to enable connections between the component 110 and another package 128. For one embodiment, the pitch translation interposer 106 has a nominal thickness (i.e., z-height) of approximately 60-63 μm. Interconnect structures 102 may be used for coupling the interposer 106 to the package 128. For one embodiment, the interconnect structures 102 and the pitch translation interposer 106 collectively have a nominal thickness (i.e., z-height) of approximately 63 μm.

As alluded to above, the package 100 also includes a package 128 coupled to the component 110 via the interposer 106. The package 128 may one or more components 116A-B (e.g., one or more semiconductor dies, a system-on-chip (SoC), a central processing unit (CPU) component, a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof, etc.). The package 128 may also comprise one or more layers 120 (e.g., dielectric layers, metal layers, other layers, etc.), and electrical connections (not shown). These electrical connections include, but are not limited to, wire bonds. The package 128 may also comprise a mold compound 104 that encapsulates the components 116A-B and the one or more layers 120. As used herein, "encapsulating" does not require all surfaces of the components 116A-B to be encased within a mold compound. For a first example, the top surfaces of the layer(s) 120 are encased in the mold compound 120, while the mold compound 120 is not formed over the lateral surfaces of the pillars 206. For a second example, and as illustrated in FIG. 1A, the lateral and top sides of the components 116A-B are encased in the mold compound 120. Additional encapsulation operations may be subsequently performed in order to provide chemical and mechanical protection to the top surface of the package 128. In some embodiments, the amount of mold compound 104 is controlled to achieve a specified z-height. Alternatively, an amount of the mold compound 104 can be removed after application in order to expose the top and/or lateral surfaces of the package 128. As shown in FIG. 1A, it is not required that that the top surfaces of the package 128 are exposed, and the mold compound 120 may cover the top surfaces of the package 128 in an embodiment. For one embodiment, the package 128 has a nominal thickness (i.e., z-height) of approximately 420 μm.

The package 100 can be designed to have a nominal thickness (i.e., z-height) of approximately 869 μm to 915 μm and a die-to-substrate ratio that is equal to or greater than 0.85. Furthermore, the use of the pillars 114A-B, the interposer 106, and the solder bumps 112 can assist with preventing or minimizing warpage of the package 100.

Figure 1B:
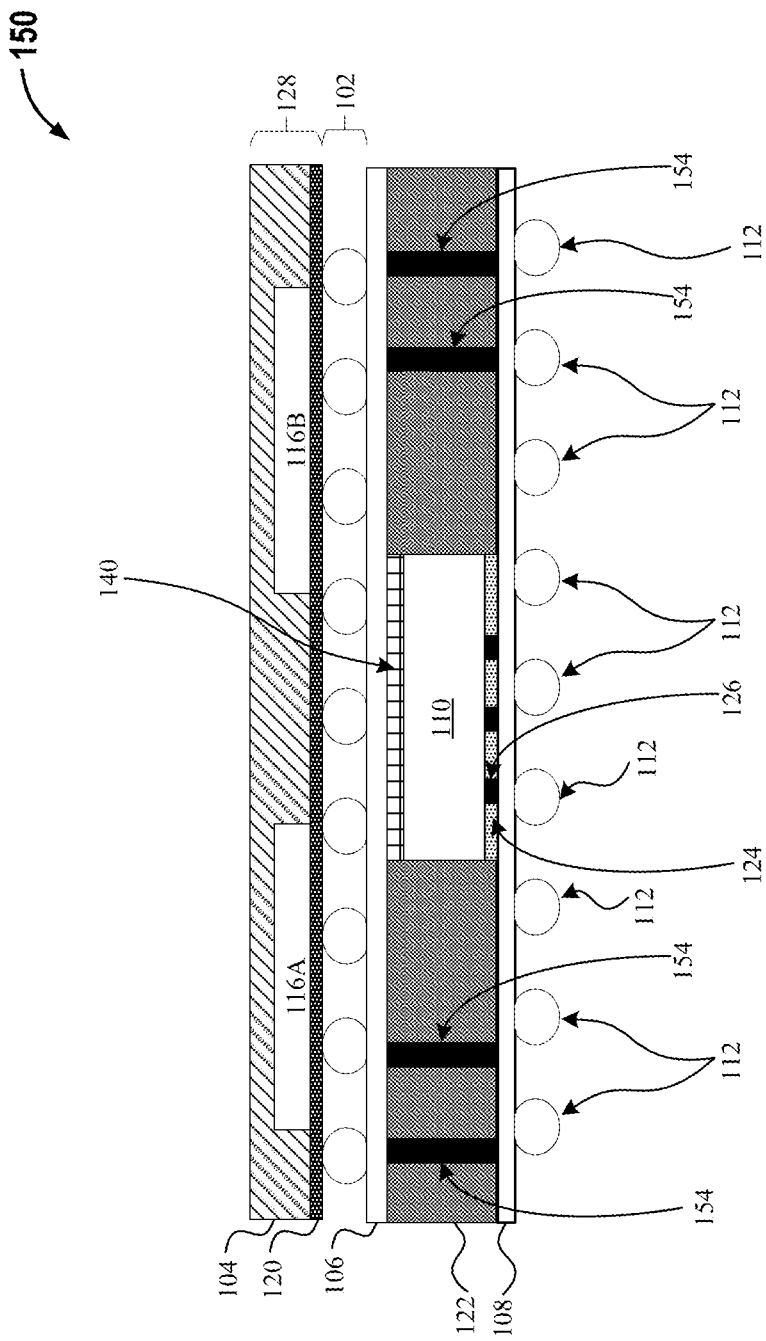

With regard now to FIG. 1B, which is a cross-sectional illustration of an ultra-thin, hyper-density semiconductor package 150 that includes a package-on-package (PoP) architecture according to one or more embodiments. The package 150 shown in FIG. 1B includes many of the same components described above in connection with the package 100 shown in FIG. 1A. For brevity, only the differences between the package 150 and the package 100 are described below in connection with FIG. 1B.

One difference between the package 150 and the package 100 is that the package 150 includes pillars 154 (instead of the pillars 114 described above in connection with FIG. 1A). The pillars 154, in some embodiments, are designed without solder caps (e.g., the solder caps 138 shown in FIG. 1A, etc.). In these embodiments, top surfaces of the pillars 154 are exposed through a grinding/polishing process (e.g., chemical mechanical polishing/planarization (CMP) techniques, any other suitable technique, etc.). Consequently, and for these embodiments, no solder caps are required on top of the pillars 154. As a result, the interposer 106 can be coupled directly to the exposed top surfaces of the pillars 154. For example, the interposer 106 can be soldered directly to the exposed top surfaces of the pillars 154.

FIGS. 2A-2I are cross-sectional side view illustrations of a method of forming an ultra-thin, hyper-density semiconductor package according one or more embodiments. The method shown in FIGS. 2A-2I can be used, for example, to form the packages 100 and 150 described above in connection with FIGS. 1A-1B.

Figure 2A:
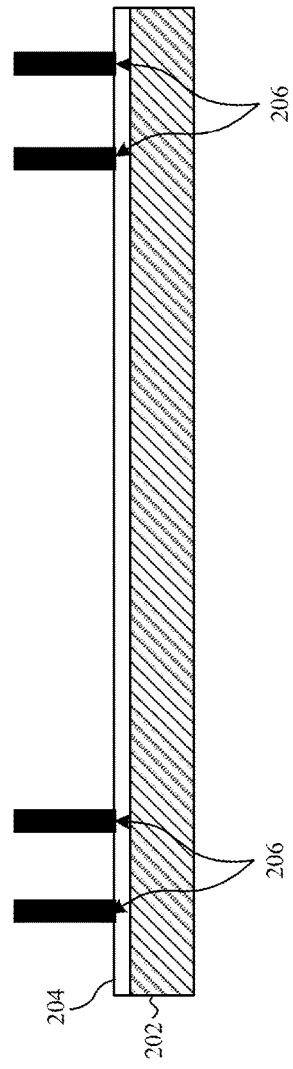
FIGS. 2A-2I are cross-sectional side view illustrations of a method of forming an ultra-thin, hyper-density semiconductor package according an embodiment.

Referring now to FIG. 2A, a HDP substrate 204 with metal pillars 206 is disposed on a carrier substrate 202, e.g., a silicon wafer, a glass wafer, a metal carrier etc. An adhesive layer (not shown) may be applied on the carrier substrate 102 prior to application of the HDP substrate 204. The adhesive layer can be a temporary adhesive, e.g., a polyimide adhesive, a polymeric bonding agent, adhesive tapes, etc. Furthermore, and as shown in FIG. 2A, metal pillars 206 may be formed on the HDP substrate 104. For one embodiment, the metal pillars 206 may be formed using lithographically-based techniques as is known in the art. The metal pillars 206 may be formed from copper or any other suitable metal or metal alloy.

Figure 2B:
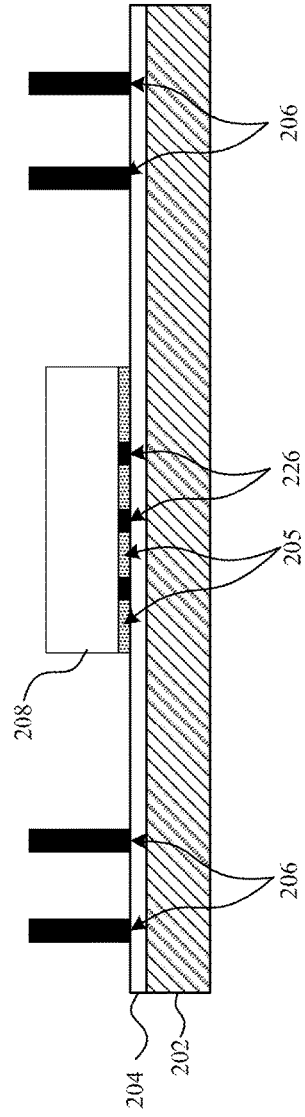

Referring now to FIG. 2B, a component 208 (e.g., an SoC chip, etc.) may be transferred onto the HDP substrate 204. For one embodiment, the component 208 includes one or more semiconductor dies and/or other electrical components. The component 208 may be attached via any suitable chip attach technology (e.g., thermo-compression bonding (TCB) technology, etc.). For one embodiment, the component 208 is attached to the substrate 204 via FLIs 226 and an epoxy material 205. The epoxy material 205 may also be used to fill gaps between the component 208 and the substrate 204.

Figure 2C:
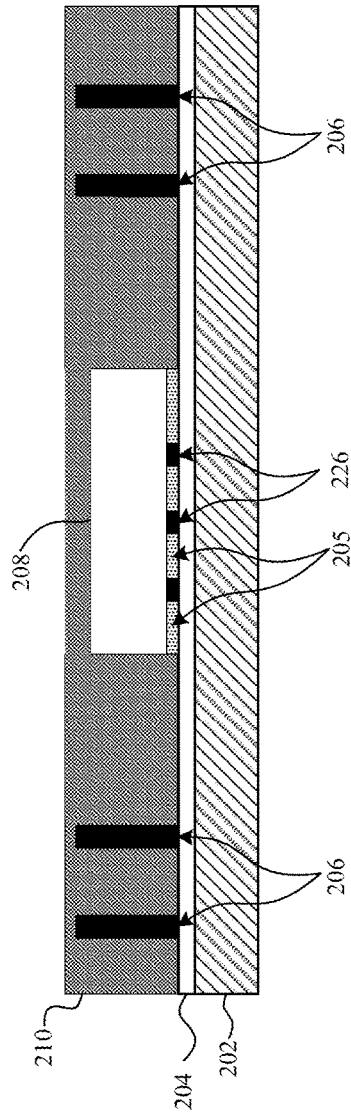

Referring now to FIG. 2C, the component 208 and the pillars 206 are encapsulated in a first mold compound 210 on the substrate 204. As used herein, "encapsulating" does not require all surfaces to be encased within a mold compound. For a first example, the lateral sides of the pillars 206 are encased in first mold compound 210, while the mold compound 210 is not formed over the top surface of the pillars 206. For a second example, and as illustrated in FIG. 2C, the lateral and top sides of the component 208 and the pillars 206 are encased in first mold compound 210. Additional encapsulation operations may be subsequently performed in order to provide chemical and mechanical protection to the top surface of the component 208 and/or the pillars 206. In some embodiments, the amount of mold compound 210 is controlled to achieve a specified z-height. Alternatively, an amount of the mold compound 210 can be removed after application in order to expose the top and/or lateral surfaces of the component 208 and/or the pillars 206. As shown in FIG. 2C, it is not required that that the top surfaces of the component 208 and/or the pillars 206 are exposed, and the mold compound 210 may cover the top surfaces of the component 208 and/or the pillars 206 in an embodiment.

Figure 2D:
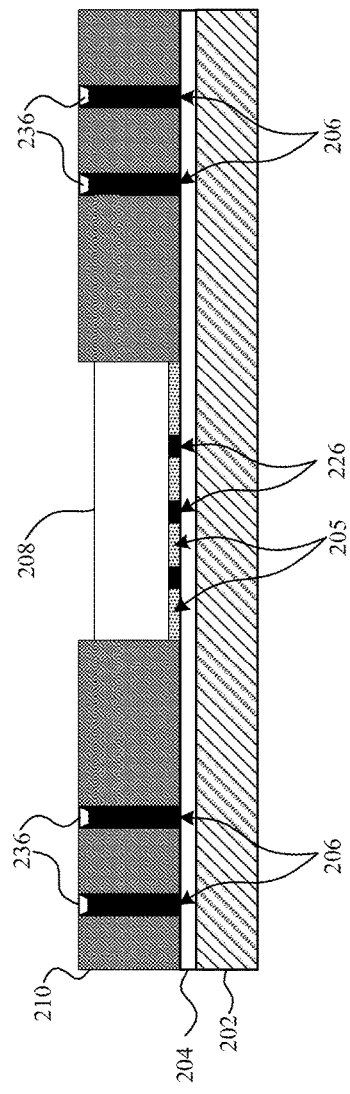

Referring now to FIG. 2D, the mold compound 210 may be removed or etched away to reveal or expose top and/or lateral surfaces of the component 208 and the pillars 206. For one embodiment, a top surface of the component 208 is exposed via planarization of the mold compound 210 and top surfaces of the pillars are exposed via laser etching techniques. For one embodiment, a fine beam laser may be used to expose and clean top surfaces of the pillars. The laser may also be used to form a shallow hole 236 in each of the pillars 206.

Figure 2E:
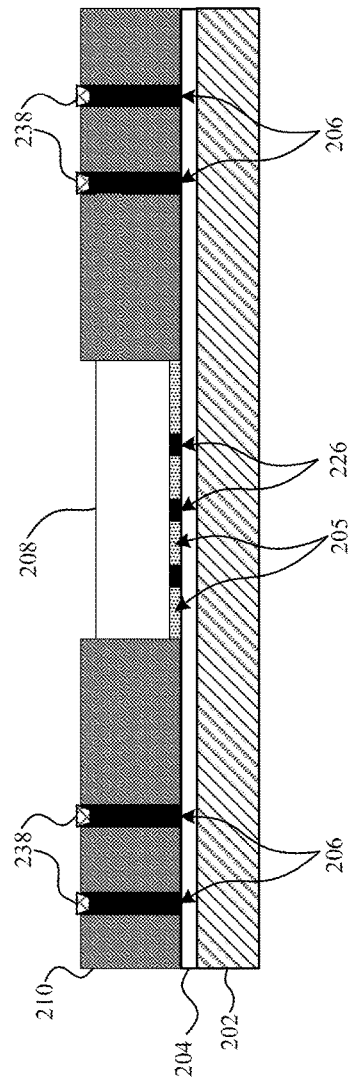

With regard now to FIG. 2E, a low temperature solder material (e.g., Sn57 Bi, SAC305, etc.) may be inserted into the shallow holes 236 and reflowed to form solder caps 238. For one embodiment, the caps 238 are above the mold compound 210 by a predetermined z-height (e.g., approximately 10 μm, etc.). For one embodiment, the low temperature solder may be inserted or applied to the shallow holes 236 via a paste print solder process that involves using a stencil or via an injection molded solder (IMS) process. The solder caps 238 may be planarized and cleaned to achieve the desired z-height.

Figure 2F:
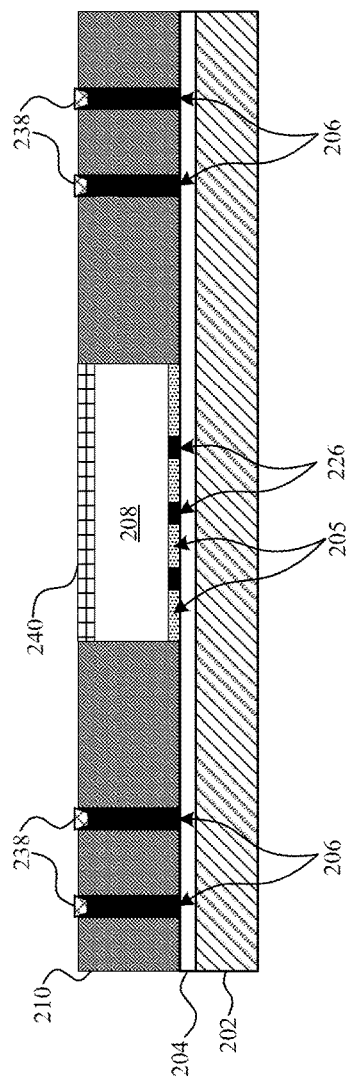

With regard now to FIGS. 2F(i)-2F(ii), an epoxy material 240 with a predetermined thickness (e.g., approximately 25 μm, etc.) and a predetermined thermal conductivity (e.g., approximately 3-5 W/mK, etc.) may be applied on the exposed top surface of the component 208. The epoxy material 240 can be a paste or a film. When the epoxy material 240 is a paste, it is printed onto the component 208. When the epoxy material 240 is a film, it is laminated onto the component 208.

With specific regard again to FIG. 2F(i), the pillars 206 are designed with the solder caps 238, as described above in connection with FIGS. 2D-2E. Other embodiments, however, are not so limited. For example, and with regard to FIG. 2F(ii), pillars 206 may be similar to the pillars 154 described above in connection with FIG. 1B. In these alternative embodiments, top surfaces of the pillars 206 are exposed through a grinding/polishing process (e.g., chemical mechanical polishing/planarization (CMP) techniques, any other suitable technique, etc.). Consequently, and for these alternative embodiments, no shallow holes 236 and solder caps 238 are required on top of the pillars 206, and the interposer 242 can be coupled directly to the exposed top surfaces of the pillars 206. For example, the interposer can be soldered directly to the exposed top surfaces of the pillars 206.

Figure 2G:
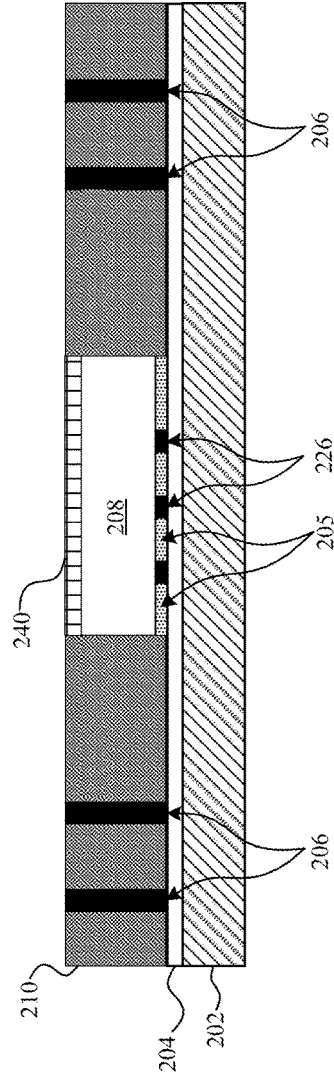
Figure 2G:
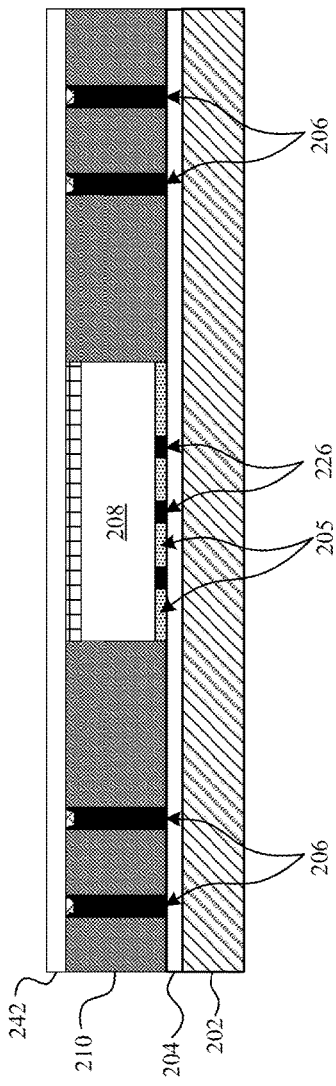
Figure 2H:
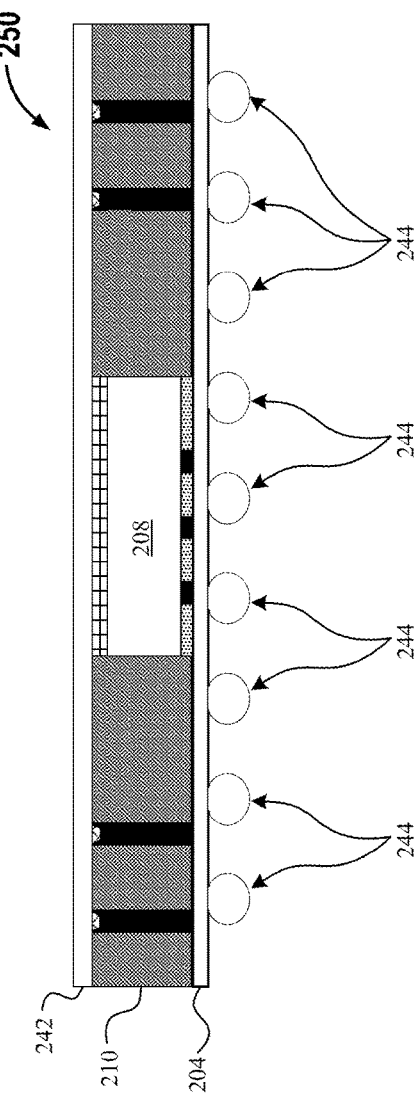

Moving on to FIG. 2G, a pitch translation interposer 242 is applied or disposed on exposed top surfaces of the epoxy material 240, the mold compound 210, and the solder caps 238. For one embodiment, the solder caps 238 are reflowed to secure the interposer 242. With regard now to FIG. 2H, a package 250 is formed after the carrier substrate 202 is removed, contact pads of the HDP substrate 204 are cleaned, and solder bumps 244 formed from low temperature solder materials (e.g., Sn57Bi, etc.) are attached and reflowed. For one embodiment, the package 250 is designed to have a nominal thickness (i.e., z-height) of approximately 869 μm to 915 μm and a die-to-substrate ratio that is equal to or greater than 0.85. Furthermore, the use of the pillars 206, the interposer 242, and/or the solder bumps 244 can assist with preventing or minimizing warpage of the package 100.

Figure 2I:
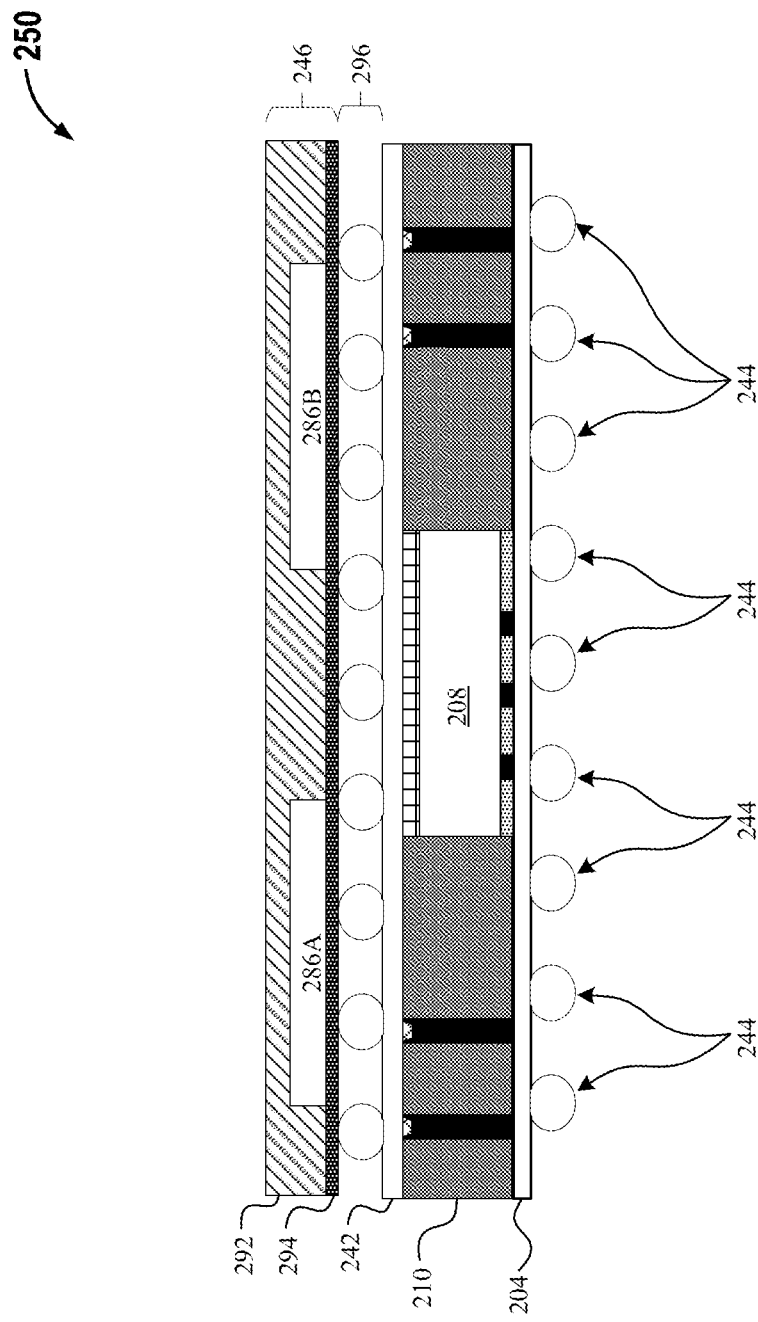

Moving on to FIG. 2I, another package 246 may optionally be attached to the interposer 242. The package 246 may include one or more components 286A-B (e.g., semiconductor dies, other electrical components, etc.) disposed on one or more layers 294 (e.g., metal layers, dielectric layers, passivation layers, redistribution layers, etc.), where the components 286A-B and the layer(s) 294 are encapsulated in a second mold compound 292. The package 246 may be attached to the interposer via any suitable attachment mechanism 296 (e.g., bumps, microbumps, etc.). The attachment mechanism 296 can be formed from solder materials (e.g., low temperature solder materials, etc.).

Figure 3:
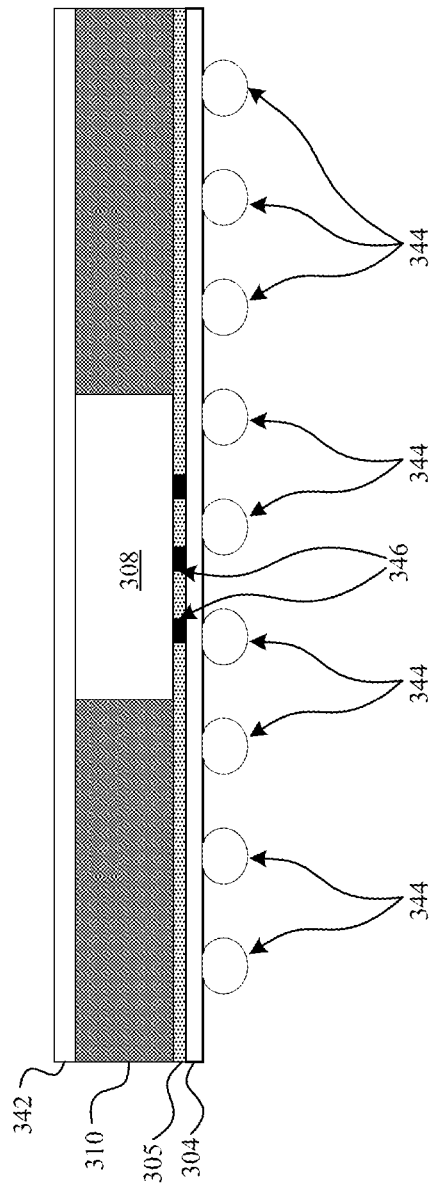
FIG. 3 is a cross-sectional illustration of an ultra-thin, hyper-density semiconductor package according another embodiment.

FIG. 3 is a cross-sectional illustration of an ultra-thin, hyper-density semiconductor package 300 according another embodiment. For one embodiment, the package 300 is formed using coreless substrate technology, die back metallization, and low temperature solder technology for ball grid array (BGA) metallurgy. As a result, the package 300 can be designed as an ultra-thin, hyper density package that has safeguards against warpage. For a specific embodiment, the package 300 has a nominal thickness (i.e., a z-height) of 425-750 µm.

As shown, the package 300 includes an HDP substrate 304, a component 308, first level interconnects (FLIs) 346, an epoxy layer 305, a mold compound 310, a die and mold back metallization layer 342, and solder bumps 344. The HDP substrate 304 can comprise at least one hyper density layer and at least one dielectric layer. The HDP substrate 304 can be formed from any suitable material (e.g., silicon, glass, metal, etc.). For one embodiment, the HDP substrate 304 has a nominal thickness (i.e., a z-height) of 150-180 µm.

The component 308 may be coupled to the substrate 304 via FLIs 346 and the epoxy layer 305. The component 308 can be a semiconductor die or a multiple die configuration. Multiple die configurations can include a variety of passive components, active components, active and passive components, and/or SoCs. Accordingly, a variety of combinations are possible. For one embodiment, the component 308 has a nominal thickness (i.e., a z-height) of 110-300 µm. The component 308 can also be similar to or the same as any of the components described above in connection with FIGS. 1-2I.

The epoxy layer 305 is disposed on the HDP substrate 305 and may be used to fill gaps between the FLIs 346. The layer 305 can be formed from any suitable epoxy material as is known in the art of semiconductor manufacturing and fabrication (e.g., epoxy resin, phenolic resin, etc.). For one embodiment, the epoxy layer 305 and the FLIs 346 have a combined nominal thickness (i.e., a z-height) of 35 µm.

A mold compound 310 may encapsulate the component 308 and the epoxy layer 305. For one embodiment, the mold compound 310 has a nominal thickness of 150-180 µm. For one embodiment, top surfaces of the mold compound 310 and the component 308 are co-planar with each other. A die and mold back metallization layer 342 may be disposed on top, exposed surfaces of the mold compound 310 and the component 308. The metallization layer 342 may be formed from any suitable metal or metal alloy (e.g., copper, etc.) and may include one or more metal layers (e.g., an adhesion layer, etc.). For one embodiment, the metallization layer 342 has a nominal thickness (i.e., a z-height) of 30-100 µm.

The package 300 also includes solder bumps 344 formed on a bottom side of the HDP substrate 304. The bumps 344 can be formed from any suitable solder materials (e.g., low temperature solder materials, etc.). For a specific embodiment, the bumps 344 are formed from Sn57Bi. The bumps 344 may be designed to have a minimum second level interconnect (SLI) pitch of 0.35. For one embodiment, the bumps 344 have a nominal thickness (i.e., a z-height) of 100-150 µm.

Figure 4:
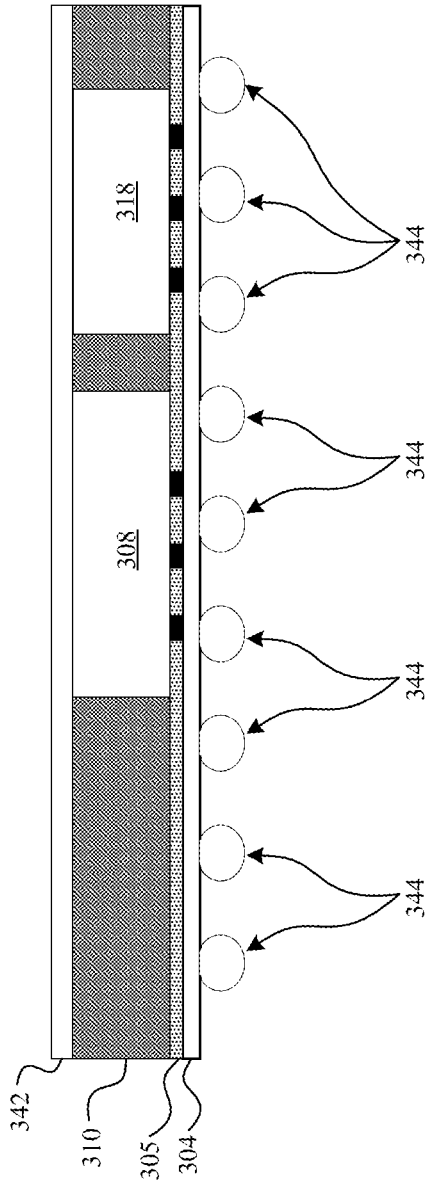
FIG. 4 is a cross-sectional illustration of an ultra-thin, hyper-density semiconductor package according yet another embodiment.

FIG. 4 is a cross-sectional illustration of an ultra-thin, hyper-density semiconductor package 400 according another embodiment. The package 400 includes many of the same components as the package 300, which is described above in connection with FIG. 3. For brevity, only the differences between the package 400 and the package 300 are described below in connection with FIG. 4.

One difference between the package 300 and the package 400 is that the package 400 includes multiple components 308 and 318. Each of the components 308 and 318 can be semiconductor dies. Each of the components 308 and 318 can include one or more active and/or passive electronic device components—e.g., transistors, memories, capacitors, resistors, optoelectronic devices, switches, interconnects, and any other electronic device components. For one embodiment, at least one of the components 308 and 318 includes a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof. For one embodiment, each of the components 308 and 318 has a nominal thickness (i.e., a z-height) of 110-300 µm. Furthermore, the z-heights of the components 308 and 318 may or may not be the same.

FIGS. 5A-5I are cross-sectional side view illustrations of a method of forming an ultra-thin, hyper-density semiconductor package according another embodiment. For one embodiment, the method shown in FIGS. 5A-5I can be used to fabricate packages similar to the packages 300 and 400 described above in connection with FIGS. 3-4.

Figure 5A:
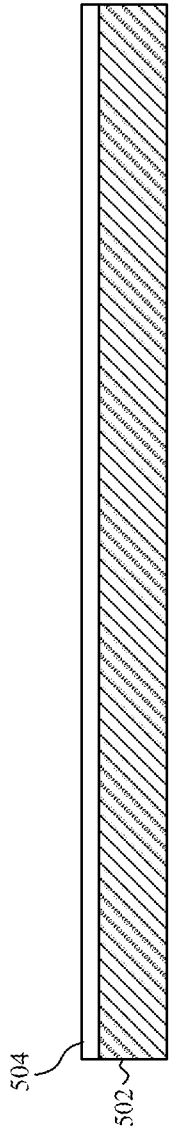
FIGS. 5A-5I are cross-sectional side view illustrations of a method of forming an ultra-thin, hyper-density semiconductor package according another embodiment.

With regard now to FIG. 5A, an HDP substrate 504 may be formed or applied to a blank panel 502 (which can also be referred to as a detach core 502). This blank panel 502 may be a peelable core, and may be constructed with various materials, such as copper (Cu), or one or more other suitable materials, metals, or metal alloys. For example, a blank panel 502 may include several layers of epoxy resin disposed between layers of copper.

Figure 5B:
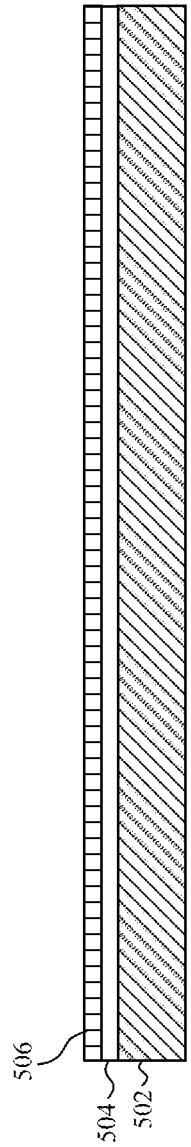

Moving on to FIG. 5B, an epoxy layer 506 may be applied on the HDP substrate 504. The epoxy layer 506 may be formed any suitable epoxy resin or composite that is in a paste form or film form. Examples of materials used to form the epoxy layer include, but are not limited to, an amine epoxy, imidizole epoxy, a phenolic epoxy, and an anhydride epoxy. When the material used to form the epoxy layer 506 is a paste, it is printed onto the substrate 504. When the material used to form the epoxy layer 506 is a film, it is laminated onto the substrate 504.

Figure 5C:
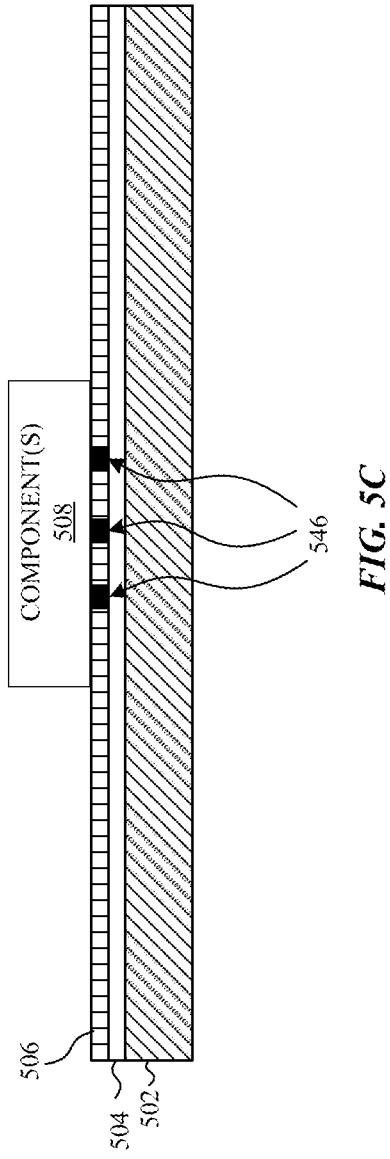

Referring now to FIG. 5C, one or more components 508 (e.g., an SoC chip, a central processing unit (CPU), a platform controller hub (PCH), a power management integrated circuit (PMIC), etc.) may be transferred onto the HDP substrate 504. For one embodiment, the component(s) 508 include one or more semiconductor dies and/or other electrical components. The component(s) 508 may be attached via any suitable chip attach technology (e.g., thermo-compression bonding (TCB) technology, etc.). For one embodiment, the component(s) 508 are attached to the substrate 504 via FLIs 546 and the epoxy layer 506. The epoxy material 506 may also be used to fill gaps between the component(s) 508 and the substrate 504. In addition, and with regard again to FIG. 5C, one or more additional structures (not shown in FIGS. 5A-5I) may be formed on substrate 504. For one embodiment, the additional structure(s) may be included to assist with propagating signals within the package formed using the method shown in FIGS. 5A-5I. The additional structure(s) include, but are not limited to one or more metal pillars. These metal pillars may be formed using lithographically-based techniques as is known in the art. The metal pillars may be formed from copper or any other suitable metal or metal alloy.

Figure 5D:
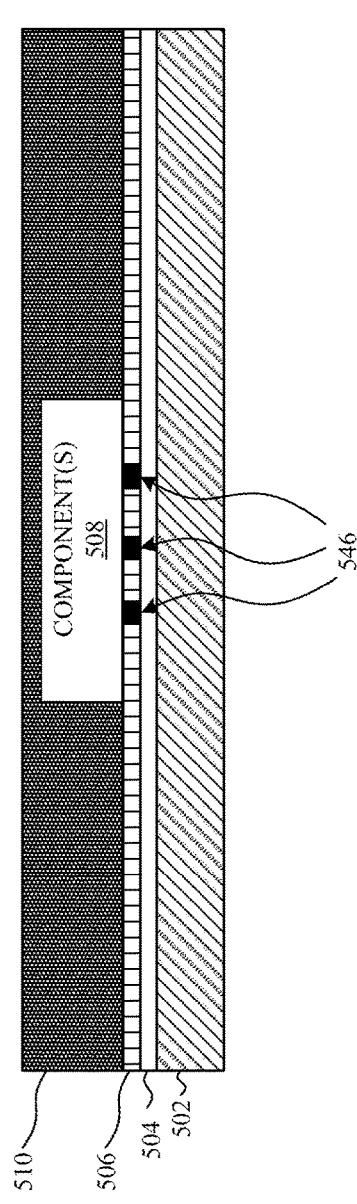

Moving on FIG. 5D, a mold compound 510 is used to encapsulate the component(s) 508 and/or any other additional structure(s) on the substrate 504 (e.g., pillars, etc.). As used herein, "encapsulating" does not require all surfaces to be encased within a mold compound. Additional encapsulation operations may be subsequently performed in order to provide chemical and mechanical protection to the top surface(s) of the component(s) 508 and/or any other additional structure(s) on the substrate 504 (e.g., pillars, etc.). In some embodiments, the amount of mold compound 510 is controlled to achieve a specified z-height. In the specific embodiment illustrated in FIG. 5D, only component(s) 508 are shown, so only component(s) 508 are encapsulated in the mold compound 510.

Figure 5E:
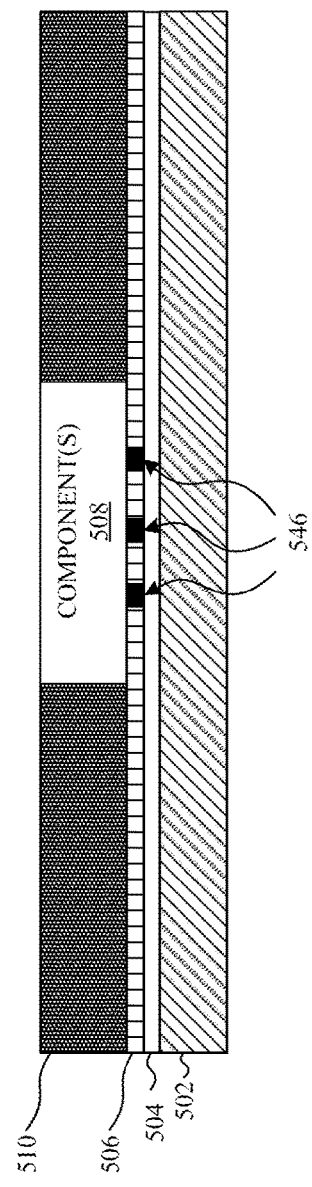

Referring now to FIG. 5E, the mold compound 510 may be removed or etched away via any suitable technique to reveal or expose top and/or lateral surfaces of the component(s) 508 and/or at least one of the additional structure(s) on the substrate 504. In the specific embodiment illustrated in FIG. 5E, only component(s) 508 are shown, so the mold compound 510 is removed or etched away to reveal or expose top and/or lateral surfaces of the component(s) 508. For a specific embodiment, planarization of the mold compound 510 is performed until top surface(s) of the component(s) 508 and/or at least one of the additional structure(s) on the substrate 504 are revealed or exposed. In the specific embodiment illustrated in FIG. 5E, only component(s) 508 are shown, so planarization of the mold compound 510 is performed until top surface(s) of the component(s) 508 are revealed or exposed. For one embodiment, exposed top surfaces of the component(s) 508 and top surfaces of the mold compound 510 are co-planar with each other. For one embodiment, exposed top surfaces of the component(s) 508, top surface(s) of at least one additional structure on the substrate 504 that is adjacent to the component(s) 508 (e.g., pillars, etc.), and top surfaces of the mold compound 510 are co-planar with each other.

Figure 5F:
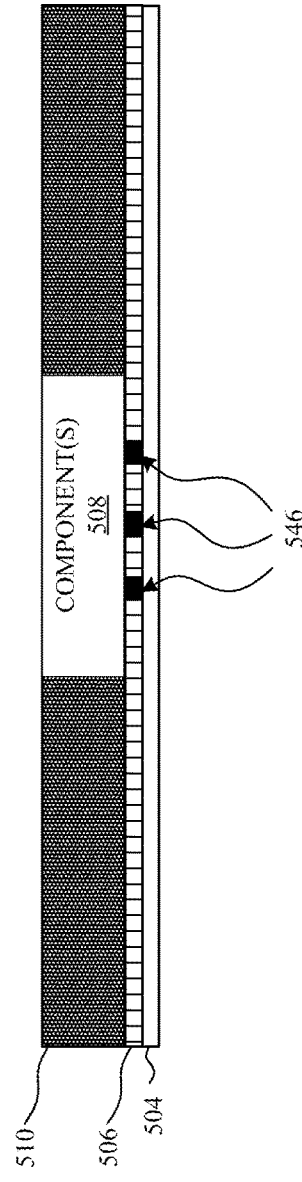

Referring now to FIG. 5F, the blank panel 502 may be removed or etched away to reveal or expose a bottom surface of the substrate 504. Any suitable removal or etching technique may be used.

Figure 5G:
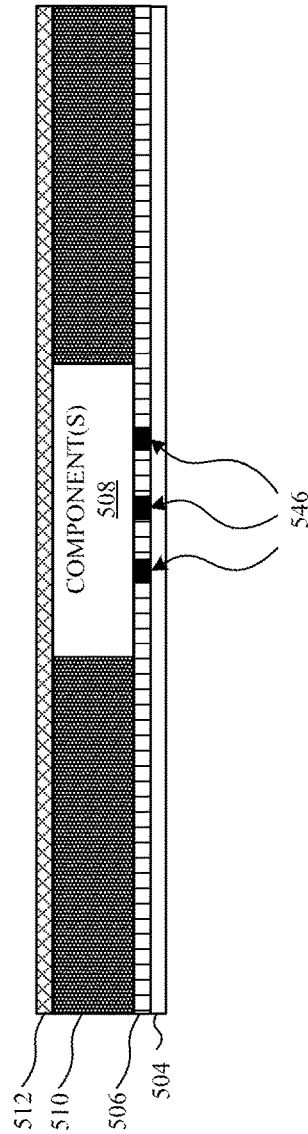

With regard now to FIG. 5G, one or more metals layers 512 may be applied on exposed top surfaces of mold compound 510 and the component(s) 508. For one embodiment, the one or more metal layers 512 are applied via sputtering, electroplating, depositing, or any other suitable technique. The one or more metal layers 512 may comprise copper, titanium, or any other suitable metal or metal alloy. For one embodiment, the one or more metal layers 512 include an adhesion layer.

Figure 5H:
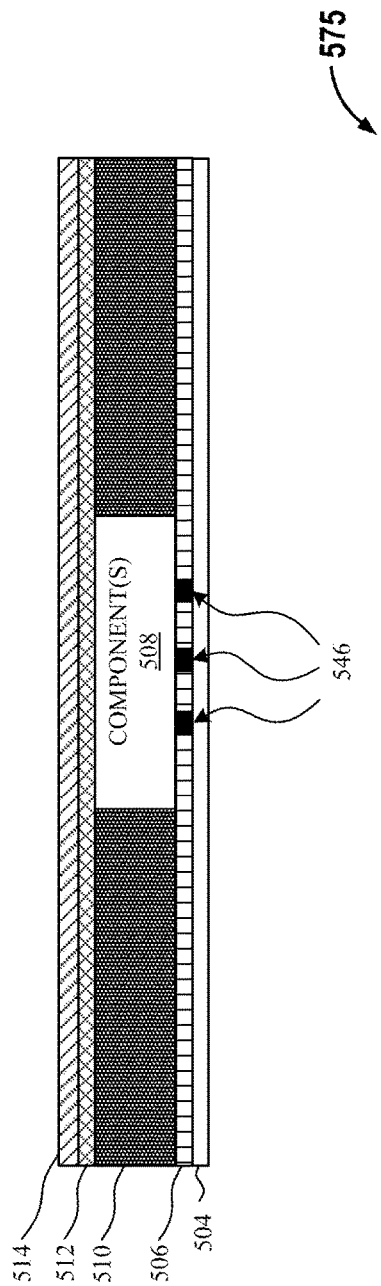

Moving on to FIG. 5H, a die and mold back metallization layer 514 is formed on the one or more metal layers 512. For one embodiment, the layer 514 is formed by electroplating a metal or metal alloy (e.g., copper, etc.) onto the layer(s) 512. For this embodiment, the layer 514 has a nominal thickness (i.e., a z-height) of approximately 30-50 μm. For another embodiment, the layer 514 is formed by printing sinterable bonding material onto the layer(s) 512. For this embodiment, the layer 514 has a nominal thickness (i.e., a z-height) of approximately 50-100 μm. The sinterable bonding material can have a low temperature range (e.g., 150° C. to 200° C.). The sinterable bonding material can be formed from copper, silver, a copper-silver alloy, or any other suitable metal or metal alloy. For yet another embodiment, the layer 514 is formed by laminating a metal or metal alloy (e.g., copper, etc.) onto the layer(s) 512. For this embodiment, the layer 514 has a nominal thickness (i.e., a z-height) of approximately 30-100 μm. The laminated metal or metal alloy used to form the layer 514 may be black oxide treated and may exhibit a thermal conductivity that is approximately 20 W/mK.

With regard again to FIGS. 5G and 5H, in some embodiments, the metal layers 512 and 514 include metal (stiffener) structures that are electroplated or deposited on the exposed top surfaces of mold compound 510 and the component(s) 508 to provide warpage control. In other embodiments, the layers 512 and 514 include one or more foils (e.g., copper foils, black oxide treated copper foils, any other foils formed from suitable metals or metal alloys, etc.). In these embodiments, the one or more foils may be attached with an adhesive on the exposed top surfaces of mold compound 510 and the component(s) 508 to provide warpage control.

Figure 5I:
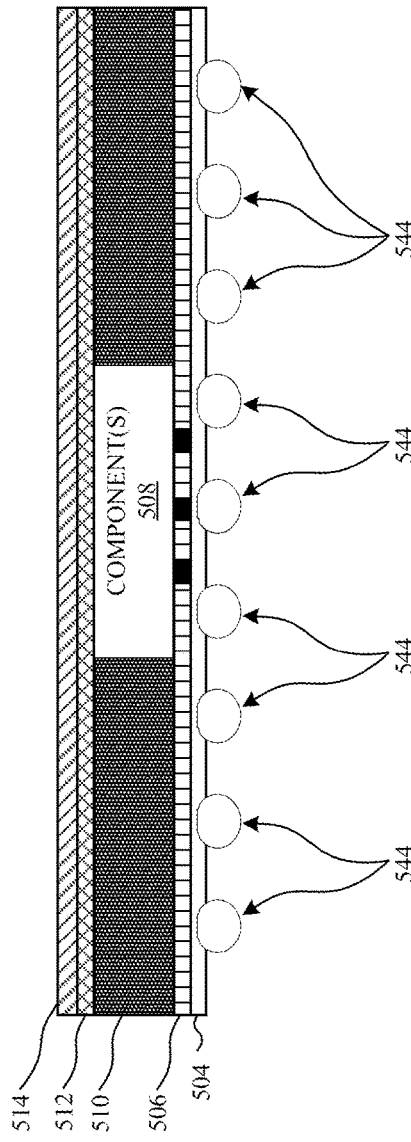

With regard now to FIG. 5I, a package 575 is formed after formation of the layers 512 and 514, contact pads of the HDP substrate 504 are cleaned, and solder bumps 544 formed from low temperature solder materials (e.g., Sn57Bi, etc.) are attached and reflowed. For one embodiment, the package 575 is designed to have a nominal thickness (i.e., z-height) of approximately 425 μm to 750 μm. For one embodiment, the package 575 is designed to have a die-to-substrate ratio that is equal to or greater than 0.70. Furthermore, the use of the layers 512 and 514, the epoxy layer 506, and the solder bumps 544 can assist with preventing or minimizing warpage of the package 575.

Although not shown in FIGS. 5A-5I, the method used to form the package 575 may, in some embodiments, include forming or disposing one or more additional structures that are adjacent to the component(s) 508 and encapsulated in the mold compound 510. The additional structure(s) may include, but are not limited to, pillars (e.g., pillars formed from metal, metal alloys, and/or any other suitable conductive material, etc.). Furthermore, for some embodiments, the layers 512 and 514 may include one or more structures that assist with propagating signals within the package 575 (e.g., vias, pads, traces, redistribution layers, etc.).

Figure 6:
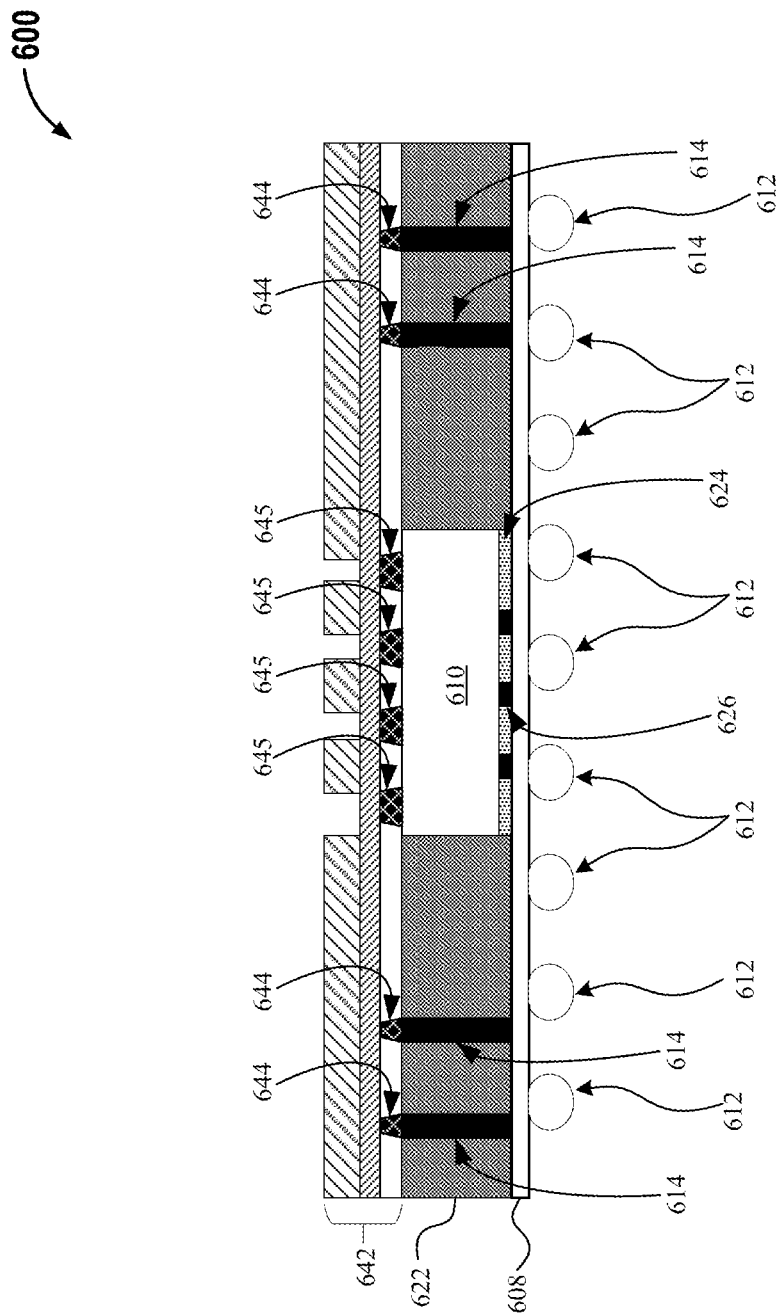
FIG. 6 is a cross-sectional illustration of an ultra-thin, hyper-density semiconductor package according one or more embodiments.

FIG. 6 is a cross-sectional illustration of an ultra-thin, hyper-density semiconductor package 600 according one or more embodiments. The package 600 includes solder bumps 612, which may be low temperature solder bumps formed from tin (Sn) or tin alloys (e.g., Sn—Al alloys, Sn—In alloys, Sn—Bi alloys, etc.). For one embodiment, the solder bumps 612 are formed from an Sn-57 Bi-1 alloy.

The package 600 also includes a high density (HDP) ultra-thin substrate 608 onto which the solder bumps 612 are formed. The HDP substrate 608 may be formed from any suitable material (silicon, glass, metal, etc.). For one embodiment, the substrate 608 has a nominal thickness (i.e., z-height) of approximately 66 μm to 70 μm. For one embodiment, a top side of the substrate 608 has metal pillars 614 (e.g., copper pillars, etc.) formed thereon. For one embodiment, the metal pillars 614 have a maximum nominal thickness (i.e., z-height) that is approximately 150 μm.

The package 600 also includes a component 610. For one embodiment, the component 610 can include one or more of a system-on-chip (SoC), a central processing unit (CPU) component, a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof. The component 610 may include one or more semiconductor dies mounted on the HDP substrate 608. The dies of the component 610 can be attached to the HDP substrate 608 according to a variety of suitable configurations including, a flip-chip configuration or other configurations such as wire bonding and the like. In the flip-chip configuration, an active side of the dies 602 is attached to a surface of the substrate 608 using interconnect structures such as bumps or pillars. Examples of such interconnect structures include, but are not limited to, Cu bumps, any type of low-lead or lead-free solder bumps, tin-copper bumps, Cu pillars, combinations thereof, or the like. The active side of the dies in the component 610 may have one or more transistor devices formed thereon. Each of the dies in the component 610 may represent a discrete chip. The dies in the component 610 may, include, or be a part of a processor, memory, or application specific integrated circuit (ASIC).

As shown in FIG. 6, the component 610 may be coupled to the substrate 608 via the first level interconnects (FLIs) 626 and an epoxy layer 624. The FLIs 626 can have a nominal thickness (i.e., a z-height, etc.) of approximately 35 μm. The epoxy layer 624 can have a nominal thickness (i.e., a z-height, etc.) of approximately 25 μm. For some embodiments, a substrate pad may have nominal thickness (i.e., a z-height, etc.) of 40 μm. For some embodiments, a pad-trace component may have nominal thickness (i.e., a z-height, etc.) of 10 μm.

The component 610 and the pillars 614 may be encapsulated in a first mold compound 622. The component 610 may be a monolithic package (e.g., a monolithic SoC, etc.). Furthermore, the component 610 may be designed to have a nominal thickness (i.e., z-height) of approximately 125 μm.

For one embodiment, top surfaces of the pillars 614, the component 610, and the mold compound 622 are co-planar with each other. The co-planar top surfaces may be achieved by grinding/polishing top surfaces of the pillars 614, the component 610, and the mold compound 622.

The package 600 also includes one or more layers 642. The layer(s) 642 can include a buildup layer (e.g., Ajinomoto Buildup Film (ABF), liquid crystal polymer, benzocyclobutene (BCB), polyimide, prepreg (a weaved fiber network "preimpregnated" into an epoxy matrix), epoxy, a combination thereof, etc.). The layer(s) 642 may include a seed layer formed from conductive materials (e.g., copper, etc,) that is on the buildup layer. The seed layer can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

The layer(s) 642 may also include a photoresist layer that is deposited using a dry film process on the seed layer. In another embodiment, the photoresist layer is deposited by application of a solution using for example, a spin-coating, a slit-coating, a spray-coating, or any other coating technique, or any other photoresist depositing techniques known to one of ordinary skill in the art of electronic device manufacturing. For one embodiment, a thickness of the photoresist layer is determined by the sum of the pad height and the via height. The photoresist layer may be patterned to form metal features on exposed and co-planar surfaces of the pillars 614, the mold compound 622, and the component 610. Generally, a semi-additive metallization process involves forming a photoresist mask that defines the regions of a substrate on which metal features are formed later on in a process. These metal features includes vias and traces 644, 645. The vias and traces 645 may be in contact with one or more pads of the component 610. For one embodiment, the layer(s) 642 have a nominal thickness (i.e., z-height) of approximately 10 μm. For one embodiment, the layer(s) 642 include one or more redistribution layers.

The package 600 can be designed to have one or more of the following: (i) a nominal thickness (i.e., z-height) of approximately 285 μm to 365 μm; and (ii) a die-to-substrate ratio that is equal to or greater than 0.85. Furthermore, the pillars 614 and the solder bumps 112 in the package 600 can assist with preventing or minimizing warpage of the package 600.

FIGS. 7A-7G are cross-sectional side view illustrations of a method of forming an ultra-thin, hyper-density semiconductor package according one or more embodiments. The method shown in FIGS. 7A-7G can be used, for example, to form the package 600 described above in connection with FIG. 6.

Figure 7A:
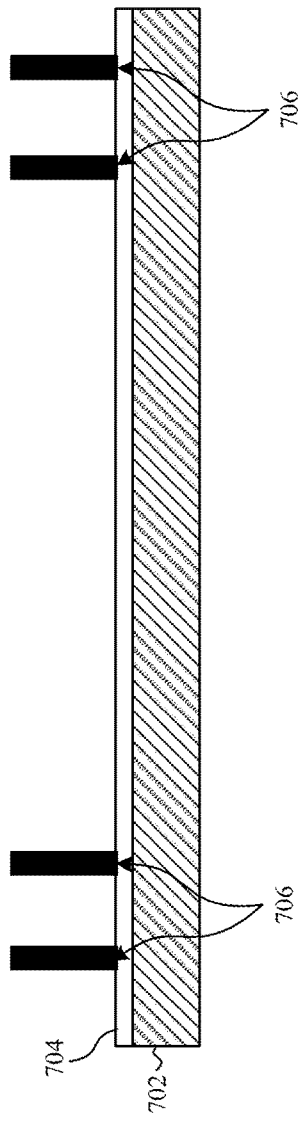

Referring now to FIG. 7A, a HDP substrate 704 with metal pillars 706 is disposed on a carrier substrate 702, e.g., a silicon wafer, a glass wafer, a metal carrier etc. An adhesive layer (not shown) may be applied on the carrier substrate 702 prior to application of the HDP substrate 704. The adhesive layer can be a temporary adhesive, e.g., a polyimide adhesive, a polymeric bonding agent, adhesive tapes, etc. Furthermore, and as shown in FIG. 7A, metal pillars 706 may be formed on the HDP substrate 704. For one embodiment, the metal pillars 706 may be formed using lithographically-based techniques as is known in the art. The metal pillars 706 may be formed from copper or any other suitable metal or metal alloy.

Figure 7B:
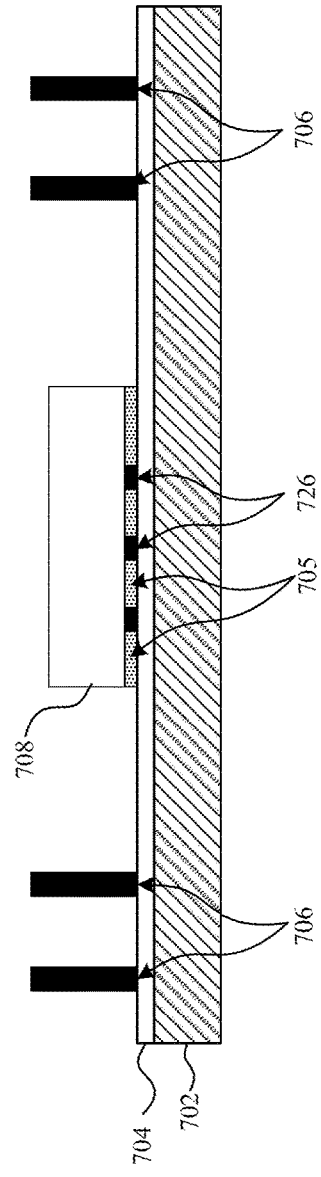

Referring now to FIG. 7B, a component 708 (e.g., an SoC chip, etc.) may be transferred onto the HDP substrate 704. For one embodiment, the component 708 includes one or more semiconductor dies and/or other electrical components. The component 708 may be attached via any suitable chip attach technology (e.g., thermo-compression bonding (TCB) technology, etc.). For one embodiment, the component 708 is attached to the substrate 704 via FLIs 726 and an epoxy material 705. The epoxy material 705 may also be used to fill gaps between the component 708 and the substrate 704.

Figure 7C:
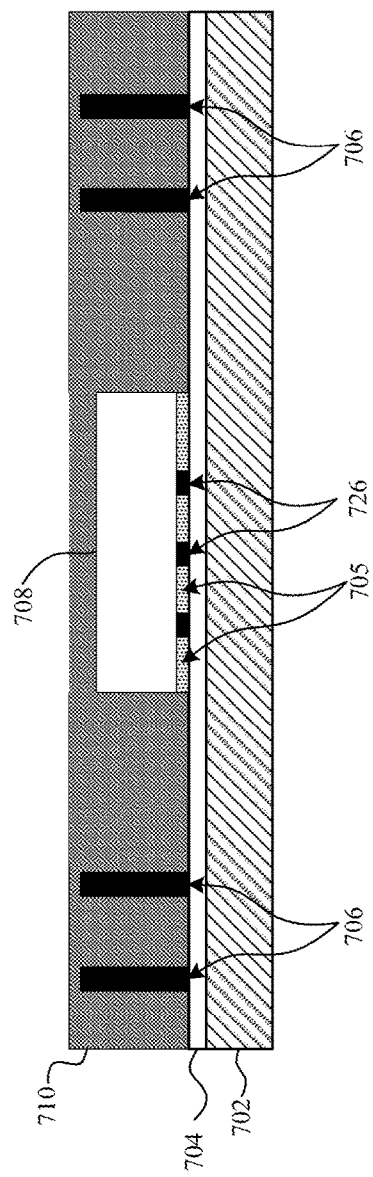

Referring now to FIG. 7C, the component 708 and the pillars 706 are encapsulated in a first mold compound 710 on the substrate 704. As used herein, "encapsulating" does not require all surfaces to be encased within a mold compound. For a first example, the lateral sides of the pillars 706 are encased in first mold compound 710, while the mold compound 710 is not formed over the top surfaces of the pillars 706. For a second example, and as illustrated in FIG. 7C, the lateral and top sides of the component 708 and the pillars 706 are encased in first mold compound 710. Other examples are possible. Additional encapsulation operations may be subsequently performed in order to provide chemical and mechanical protection to the top surface(s) of the component 708 and/or the pillars 706. In some embodiments, the amount of mold compound 710 is controlled to achieve a specified z-height. Alternatively, an amount of the mold compound 710 can be removed after application in order to expose the top and/or lateral surfaces of the component 708 and/or the pillars 706. As shown in FIG. 7C, it is not required that that the top surfaces of the component 708 and/or the pillars 706 are exposed, and the mold compound 710 may cover the top surfaces of the component 708 and/or the pillars 706 in an embodiment.

Referring now to FIG. 7D, the mold compound 710 may be removed or etched away via any suitable technique to reveal or expose top and/or lateral surfaces of the component 708 and the pillars 706. For one embodiment, top surface(s) of the component 708 is exposed via planarization of the mold compound 710. For one embodiment, top surfaces of the pillars 706 are exposed via laser etching techniques. For one embodiment, a fine beam laser may be used to expose and clean top surfaces of the pillars 706. For one embodiment, and as shown in FIG. 7D, top surfaces of the pillars 706, the component 708, and the mold compound 710 are exposed and co-planar with each other. The exposed and co-planar top surfaces of the pillars 706, the component 708, and the mold compound 710 may be achieved through a grinding/polishing process (e.g., chemical mechanical polishing/planarization (CMP) techniques, any other suitable technique, etc.).

Moving on to FIG. 7E, the carrier substrate 702 is removed or etched away. Any suitable removal or etching technique may be used.

With regard now to FIG. 7F, one or more layers 742 are disposed on the exposed and co-planar top surfaces of the pillars 706, the component 708, and the mold compound 710. The layer(s) 742 can include a buildup layer (e.g., Ajinomoto Buildup Film (ABF), liquid crystal polymer, benzocyclobutene (BCB), polyimide, prepreg (a weaved fiber network "preimpregnated" into an epoxy matrix), epoxy, a combination thereof, etc.). The layer(s) 742 may include a seed layer formed from conductive materials (e.g., copper, etc,) that is on the buildup layer. The seed layer can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

The layer(s) 742 may also include a photoresist layer that is deposited using a dry film process on the seed layer. In another embodiment, the photoresist layer is deposited on the seed layer by application of a solution using for example, a spin-coating, a slit-coating, a spray-coating, or any other coating technique, or any other photoresist depositing techniques known to one of ordinary skill in the art of electronic device manufacturing. For one embodiment, a thickness of the photoresist layer is determined by the sum of the pad height and the via height. The photoresist layer may be patterned to form metal features on exposed and co-planar surfaces of the pillars 704, the mold compound 710, and the component 708. Generally, a semi-additive metallization process involves forming a photoresist mask that defines the regions of a substrate on which metal features are formed later on in a process. These metal features includes vias and traces 744, 745. The vias and traces 745 may be in contact with one or more pads of the component 708. For one embodiment, the layer(s) 742 include one or more redistribution layers.

Figure 7G:
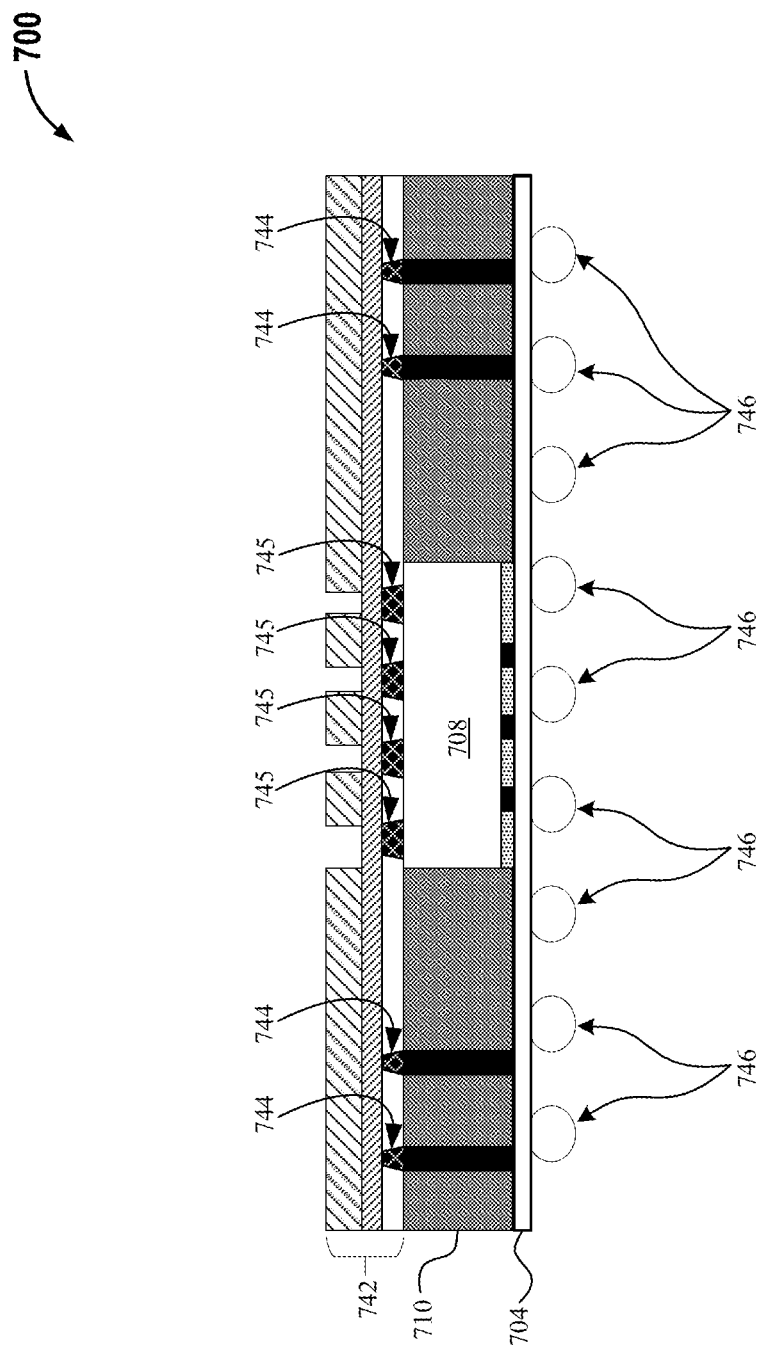

Moving on to FIG. 7G, a package 700 is formed after layer(s) 742 are formed, contact pads of the HDP substrate 704 are cleaned, and solder bumps 746 formed from low temperature solder materials (e.g., Sn57Bi, etc.) are attached and reflowed. For one embodiment, the package 700 can be designed to have one or more of: (i) a nominal thickness (i.e., z-height) of approximately 285 µm to 365 µm; and (ii) a die-to-substrate ratio that is equal to or greater than 0.84.

Furthermore, the pillars 706 and the solder bumps 746 in the package 700 can assist with preventing or minimizing warpage of the package 700.

Figure 8:
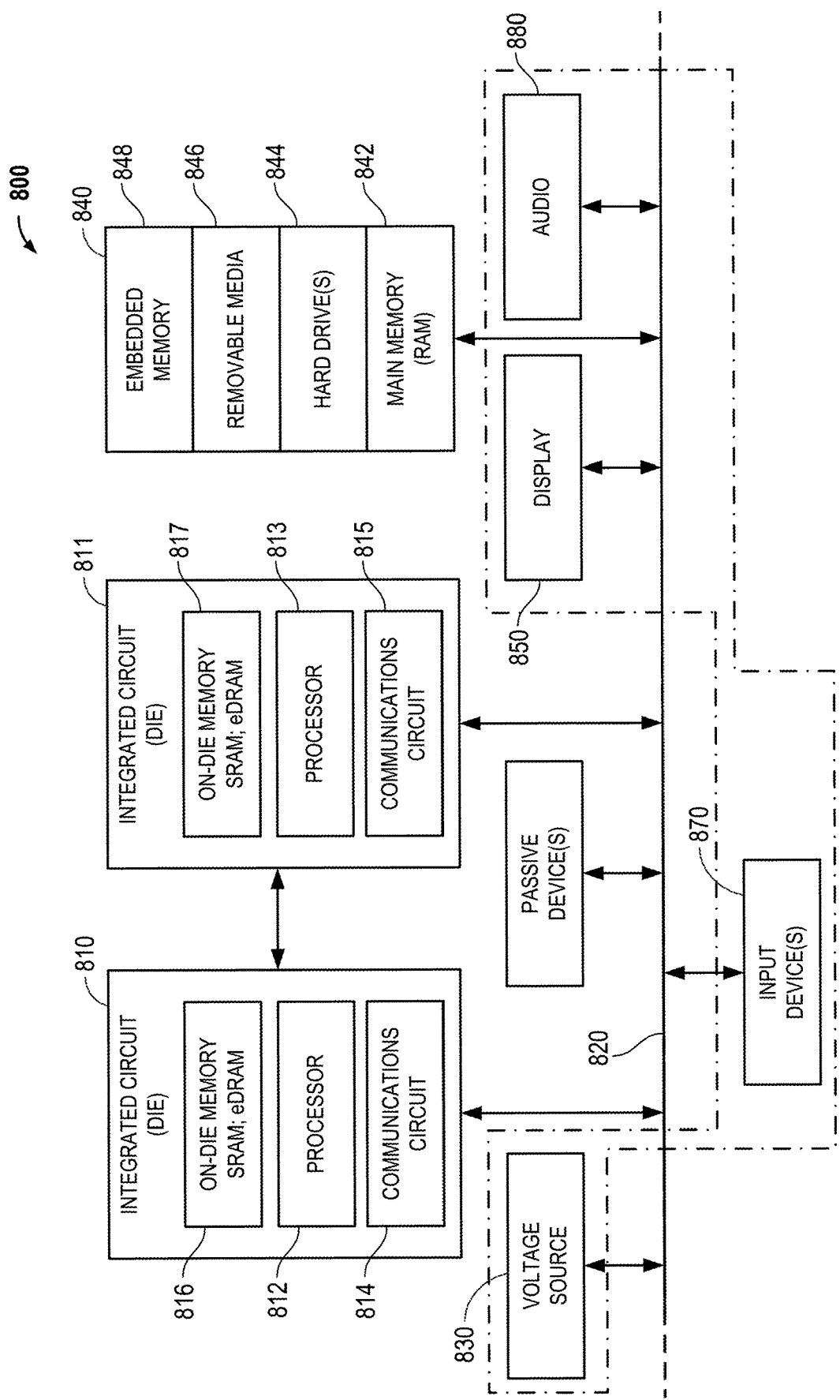
FIG. 8 is an illustration of a schematic block diagram of a computer system that utilizes an ultra-thin, hyper-density semiconductor package, according to an embodiment.

FIG. 8 illustrates a schematic of computer system 800 according to an embodiment. The computer system 800 (also referred to as an electronic system 800) can include a semiconductor package in accord with any of the embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

The electronic system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. For one embodiment, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package in accord with any of the embodiments and their equivalents, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged with a process that is in accord with any of the embodiments and their equivalents, as described in the foregoing specification.

The integrated circuit 810 may be complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package that is in accord with one or more of the embodiments described in the foregoing specification and their art-recognized equivalents, an electronic system, a computer system, one or more methods of fabricating an integrated circuit, and one or more methods of fabricating an electronic assembly that includes a semiconductor package that is in accord with one or more of the embodiments described in the foregoing specification and their art-recognized equivalents. The elements, materials, geometries, dimensions, and sequence of operations described in one or more embodiments described herein can all be varied to suit particular I/O coupling requirements including array contact count, array contact configuration for a microelectronic die embedded in a processor mounting substrate. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The descriptions provided above in connection with one or more of the embodiments described herein (e.g., descriptions of processes provided in connection with FIGS. 1A-8, etc.) may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a semiconductor package, comprising: a substrate; a plurality of metal pillars formed on a top surface of the substrate; a semiconductor component disposed on the substrate, the semiconductor component comprising one or more dies; a mold compound encapsulating the plurality of metal pillars and the semiconductor component; an interposer coupled to the plurality of metal pillars; and a plurality of solder bumps formed on a bottom surface of the substrate.

Additional embodiments described herein include a semiconductor package, wherein each metal pillar includes a solder cap that is partially encapsulated by the mold compound and wherein the interposer is coupled to the plurality of metal pillars via the solder caps.

Additional embodiments described herein include a semiconductor package, wherein a z-height of the package is less than or equal to 1 mm. Additional embodiments described herein include a semiconductor package, wherein a z-height of the package is approximately 869 µm to 915 µm.

Additional embodiments described herein include a semiconductor package, wherein a die-to-package ratio for the package is equal to or greater than 0.7.

Additional embodiments described herein include a semiconductor package, wherein the plurality of metal pillars has a pitch that is greater than or equal to 150 µm.

Additional embodiments described herein include a semiconductor package, wherein a second package is disposed on interposer.

Additional embodiments described herein include a semiconductor package, wherein a second package is disposed on interposer via an attachment mechanism.

Additional embodiments described herein include a semiconductor package, wherein a z-height of the substrate is approximately 66 µm.

Additional embodiments described herein include a semiconductor package, wherein a z-height of the semiconductor component is approximately 125 µm.

Additional embodiments described herein include a semiconductor package, wherein a z-height of the interposer is approximately 63 µm.

Embodiments described herein include a semiconductor package, comprising: a substrate; an epoxy layer disposed on a top surface of the substrate; a semiconductor component disposed on the epoxy layer; a mold compound encapsulating the epoxy layer and the semiconductor component, wherein top surfaces of the mold compound and the semiconductor component are co-planar with each other; a metallization layer formed on the top surfaces of the mold compound and the semiconductor component; and a plurality of solder bumps formed on a bottom surface of the substrate.

Additional embodiments described herein include a semiconductor package, wherein the semiconductor component comprises one or more semiconductor dies.

Additional embodiments described herein include a semiconductor package, wherein a z-height of the package is less than or equal to 1 mm. Additional embodiments described herein include a semiconductor package, wherein a z-height of the package is approximately 425 µm to 750 µm.

Additional embodiments described herein include a semiconductor package, wherein a die-to-package ratio for the package is equal to or greater than 0.7.

Additional embodiments described herein include a semiconductor package, wherein the epoxy layer has a z-height that is approximately 35 µm.

Additional embodiments described herein include a semiconductor package, wherein the metallization layer has a z height that is approximately 30 µm to 100 µm.

Additional embodiments described herein include a semiconductor package, wherein a z-height of the plurality of solder bumps is approximately 100 µm to 150 µm.

Additional embodiments described herein include a semiconductor package, wherein a z-height of the semiconductor component is approximately 110 µm to 300 µm. Additional embodiments described herein include a semiconductor package, wherein a z-height of the substrate is approximately 150 µm to 180 µm.

Embodiments described herein include a method of forming a semiconductor package, comprising: forming a plurality of metal pillars on a top surface of a substrate; disposing a semiconductor component on the top surface of the substrate; encapsulating the plurality of metal pillars and the semiconductor component in a mold compound; coupling an interposer to one or more of the plurality of metal pillars and the semiconductor component; and forming a plurality of solder bumps on a bottom surface of the substrate.

Additional embodiments described herein include a method, further comprising disposing a second package on the interposer.

Additional embodiments described herein include a semiconductor package, wherein a second package is disposed on interposer via an attachment mechanism.

Additional embodiments described herein include a method, wherein a z-height of the package is approximately 869 µm to 915 µm. Additional embodiments described herein include a method, further comprising: forming, in each metal pillar, a solder cap that is partially encapsulated by the mold compound, wherein the interposer is coupled to the plurality of metal pillars via the solder caps.

Embodiments described herein include a method of forming a semiconductor package, comprising: disposing an epoxy layer on a top surface of a substrate; disposing a semiconductor component on the epoxy layer; encapsulating the epoxy layer and the semiconductor component in a mold compound, wherein top surfaces of the mold compound and the semiconductor component are co-planar with each other; forming a metallization layer on the top surfaces of the mold compound and the semiconductor component; and forming a plurality of solder bumps on a bottom surface of the substrate.

Additional embodiments described herein include a method, wherein a z-height of the package is approximately 425 µm to 750 µm.

Embodiments described herein include a semiconductor package, comprising: a substrate; a plurality of metal pillars formed on a top surface of the substrate; a semiconductor component disposed on the substrate, the semiconductor component comprising one or more dies; a mold compound encapsulating the plurality of metal pillars and the semiconductor component, wherein top surfaces of the mold compound, the plurality of metal pillars, and the semiconductor component are co-planar with each other; and one or more layers disposed on the top surfaces, the one or more layers comprising one or more vias and traces.

Additional embodiments include a semiconductor package, wherein a z-height of the package is approximately 285 µm to 365 µm.

Additional embodiments include a semiconductor package, wherein a die-to-substrate ratio of the package is equal to or greater than 0.84.

Embodiments described herein include a method of forming a semiconductor package, comprising: forming a plurality of metal pillars on a top surface of a substrate; disposing a semiconductor component on the substrate, the semiconductor component comprising one or more dies; encapsulating the plurality of metal pillars and the semiconductor component in a mold compound, wherein top surfaces of the mold compound, the plurality of metal pillars, and the semiconductor component are co-planar with each other; and disposing one or more layers on the top surfaces, the one or more layers comprising one or more vias and traces.

Additional embodiments include a method, wherein a z-height of the package is approximately 285 µm to 365 µm.

Additional embodiments include a method, wherein a die-to-substrate ratio of the package is equal to or greater than 0.84.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For a first example, the phrase "A or B" will be understood to include the possibilities of "A" or "B" or "A and B." For a second example, the phrase "A and/or B" will be understood to include the possibilities of "A" or "B" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor assembly, comprising:
   a package comprising a first die laterally spaced apart from a second die by a first mold compound, and one or more metal layers and dielectric layers beneath the first die and the second die and the first mold compound;
   an interposer, wherein the one or more metal layers and dielectric layers of the package are coupled to the interposer by first interconnects;
   a component beneath the interposer, wherein a top surface of the component is vertically spaced apart from a bottommost surface of the interposer;
   pillars adjacent to the component and beneath the interposer;

a substrate beneath the component and the pillars, the component coupled to the substrate by second interconnects;

a second mold compound in contact with sidewalls of the component and extending above the top surface of the component, wherein the second mold compound has an uppermost surface below and in contact with the bottommost surface of the interposer; and solder bumps coupled to the substrate, first ones of the solder bumps vertically beneath the component, and second ones of the solder bumps vertically beneath the pillars.

2. The semiconductor assembly of claim 1, wherein the substrate is an ultra-thin substrate.

3. The semiconductor assembly of claim 1, wherein the substrate has a thickness in a range of 66 microns to 70 microns.

4. The semiconductor assembly of claim 1, wherein the interposer is a pitch translation interposer.

5. The semiconductor assembly of claim 1, further comprising:
an epoxy material on a top surface of the component.

6. The semiconductor assembly of claim 1, further comprising:
an epoxy layer beneath the component and laterally surrounding the second interconnects.

7. The semiconductor assembly of claim 1, wherein the first mold compound has an uppermost surface above an uppermost surface of the first die and the second die.

8. A semiconductor assembly, comprising:
a first die laterally spaced apart from a second die by a first mold compound;
one or more metal layers and dielectric layers beneath the first die and the second die and the first mold compound;
an interposer, wherein the one or more metal layers and dielectric layers are coupled to the interposer by first interconnects;
a system-on-chip (SoC) beneath the interposer, wherein a top surface of the SoC is vertically spaced apart from a bottommost surface of the interposer;
conductive copper structures adjacent to the SoC and beneath the interposer;
a substrate beneath the SoC and the conductive copper structures, the SoC coupled to the substrate by second interconnects;
a second mold compound in contact with sidewalls of the SoC and extending above the top surface of the SoC, wherein the second mold compound has an uppermost surface below and in contact with the bottommost surface of the interposer; and
solder structures coupled to the substrate, first ones of the solder structures vertically beneath the SoC, and second ones of the solder structures vertically beneath the conductive copper structures.

9. The semiconductor assembly of claim 8, wherein the substrate is an ultra-thin substrate.

10. The semiconductor assembly of claim 8, wherein the substrate has a thickness in a range of 66 microns to 70 microns.

11. The semiconductor assembly of claim 8, wherein the interposer is a pitch translation interposer.

12. The semiconductor assembly of claim 8, further comprising an epoxy material on a top surface of the SoC.

13. The semiconductor assembly of claim 8, further comprising:
an epoxy layer beneath the component and laterally surrounding the second interconnects.

14. The semiconductor assembly of claim 8, wherein the first mold compound has an uppermost surface above an uppermost surface of the first die and the second die.

15. An electronic system, comprising:
one or more system busses;
a memory device coupled to the one or more system busses; and
a semiconductor assembly coupled to the one or more system busses, the semiconductor assembly comprising:
a package comprising a first die laterally spaced apart from a second die by a first mold compound, and one or more metal layers and dielectric layers beneath the first die and the second die and the first mold compound;
an interposer, wherein the one or more metal layers and dielectric layers of the package are coupled to the interposer by first interconnects;
a component beneath the interposer, wherein a top surface of the component is vertically spaced apart from a bottommost surface of the interposer;
pillars adjacent to the component and beneath the interposer;
a substrate beneath the component and the pillars, the component coupled to the substrate by second interconnects;
a second mold compound in contact with sidewalls of the component and extending above the top surface of the component, wherein the second mold compound has an uppermost surface below and in contact with the bottommost surface of the interposer; and
solder bumps coupled to the substrate, first ones of the solder bumps vertically beneath the component, and second ones of the solder bumps vertically beneath the pillars.

16. The electronic system of claim 15, further comprising:
a passive device coupled to the one or more system busses.

17. The electronic system of claim 15, further comprising:
a display device coupled to the one or more system busses.

18. The electronic system of claim 15, further comprising:
an audio device coupled to the one or more system busses.

19. The electronic system of claim 15, further comprising:
a voltage source coupled to the one or more system busses.

20. The electronic system of claim 15, further comprising:
a processor coupled to the one or more system busses.

* * * * *